(12) United States Patent
Sato et al.

(10) Patent No.: US 11,863,128 B2
(45) Date of Patent: Jan. 2, 2024

(54) POWER AMPLIFIER CIRCUIT

(71) Applicant: Murata Manufacturing Co., Ltd., Kyoto (JP)

(72) Inventors: Hideyuki Sato, Kyoto (JP); Koshi Himeda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 511 days.

(21) Appl. No.: 17/167,406

(22) Filed: Feb. 4, 2021

(65) Prior Publication Data

US 2021/0242836 A1   Aug. 5, 2021

(30) Foreign Application Priority Data

Feb. 5, 2020 (JP) ................. 2020-018151
Dec. 4, 2020 (JP) ................. 2020-201727

(51) Int. Cl.
| | |
|---|---|
| *H03F 1/30* | (2006.01) |
| *H03F 1/08* | (2006.01) |
| *H03F 3/213* | (2006.01) |
| *H01L 27/102* | (2023.01) |
| *H01L 29/737* | (2006.01) |
| *H01L 23/00* | (2006.01) |

(52) U.S. Cl.
CPC ............ *H03F 1/08* (2013.01); *H01L 24/13* (2013.01); *H01L 27/1022* (2013.01); *H01L 29/7371* (2013.01); *H03F 3/213* (2013.01); *H01L 2224/13025* (2013.01); *H01L 2924/13051* (2013.01); *H01L 2924/1421* (2013.01); *H03F 2200/447* (2013.01); *H03F 2200/451* (2013.01)

(58) Field of Classification Search
CPC ............... H03F 1/30; H03F 3/20; H03G 3/30
USPC .................................... 330/285, 296
See application file for complete search history.

(56) References Cited

U.S. PATENT DOCUMENTS

| | | | |
|---|---|---|---|
| 6,344,775 B1 | 2/2002 | Morizuka et al. | |
| 9,013,238 B2* | 4/2015 | Ding | H03F 1/0261 330/296 |
| 9,035,701 B2 | 5/2015 | Schooley et al. | |
| 10,027,291 B2* | 7/2018 | Goto | H03F 3/21 |
| 2017/0288616 A1* | 10/2017 | Goto | H03F 3/245 |
| 2021/0242842 A1* | 8/2021 | Tokuya | H03F 3/195 |

FOREIGN PATENT DOCUMENTS

JP     2000332124 A     11/2000

* cited by examiner

*Primary Examiner* — Henry Choe
(74) *Attorney, Agent, or Firm* — Pearne & Gordon LLP

(57) ABSTRACT

A power amplifier circuit includes a first transistor disposed on a semiconductor substrate; a second transistor that supplies a bias current based on a first current which is a part of a control current to the first transistor; a current output element in which a current flowing therethrough increases in accordance with a rise in temperature; and a wiring portion including a plurality of metal layers that are electrically connected to an emitter of the first transistor and that are stacked one on top of another so as to oppose the semiconductor substrate. At least one metal layer among the plurality of metal layers extends so as to overlap an area extending from at least a part of a first disposition area in which the first transistor is disposed to a second disposition area in which the current output element is disposed in plan view of the semiconductor substrate.

20 Claims, 29 Drawing Sheets

POWER AMPLIFIER CIRCUIT

CROSS REFERENCE TO RELATED APPLICATIONS

This application claims priority from Japanese Patent Application No. 2020-018151 filed on Feb. 5, 2020, and claims priority from Japanese Patent Application No. 2020-201727 filed on Dec. 4, 2020. The contents of these applications are incorporated herein by reference in their entireties.

BACKGROUND

The present disclosure relates to a power amplifier circuit and semiconductor device. Power amplifier circuits are used to amplify radio-frequency (RF) signals in mobile communication. In a power amplifier circuit that amplifies power by using a bipolar transistor disposed on a semiconductor substrate, heat generation by the transistor during amplification causes a change in the characteristics of the transistor. The power amplifier circuit disclosed in Japanese Unexamined Patent Application Publication No. 2000-332124 causes a plurality of transistors to thermally couple to each other, thereby preventing a decrease in efficiency resulting from a rise in the junction temperature of the transistors.

BRIEF SUMMARY

In the power amplifier circuit disclosed in Japanese Unexamined Patent Application Publication No. 2000-332124, a power amplifying transistor is thermally coupled to, by a metal electrode layer, a potential generating transistor of a bias circuit that supplies a bias current to the power amplifying transistor.

A semiconductor chip including a power amplifier circuit may be mounted on a substrate by flip-chip connection. In flip-chip connection, a bump is provided in the power amplifier circuit. The semiconductor chip is mounted on the substrate with the bump interposed therebetween. In the case of flip-chip mounting a semiconductor chip including the power amplifier circuit disclosed in Japanese Unexamined Patent Application Publication No. 2000-332124, heat conduction to the substrate through a bump affects heat conduction between the transistors through the metal electrode layer, and thermal coupling is not adequately achieved.

The present disclosure increases the strength of thermal coupling between transistors in a power amplifier circuit.

According to embodiments of the present disclosure, a power amplifier circuit includes a first transistor disposed on a semiconductor substrate; a second transistor disposed on the semiconductor substrate and having a base configured to be supplied with a first current which is a part of a control current, the second transistor being configured to supply a bias current based on the first current to the first transistor; a current output element disposed on the semiconductor substrate and configured to be supplied with a second current which is a part of the control current and to output a third current based on the second current, the second current increasing in accordance with a rise in temperature; and a wiring portion including a plurality of metal layers that are disposed so as to overlap at least a part of a first disposition area in which the first transistor is disposed and an area between the first disposition area and a second disposition area in which the current output element is disposed, that are electrically connected to an emitter of the first transistor, and that are stacked one on top of another so as to oppose the semiconductor substrate. At least one metal layer among the plurality of metal layers extends so as to overlap an area extending from the at least the part of the first disposition area to the second disposition area in plan view of the semiconductor substrate.

According to embodiments of the present disclosure, it is possible to increase the strength of thermal coupling between transistors in a power amplifier circuit.

Other features, elements, characteristics and advantages of the present disclosure will become more apparent from the following detailed description of embodiments of the present disclosure with reference to the attached drawings.

DETAILED DESCRIPTION

Figure 1:
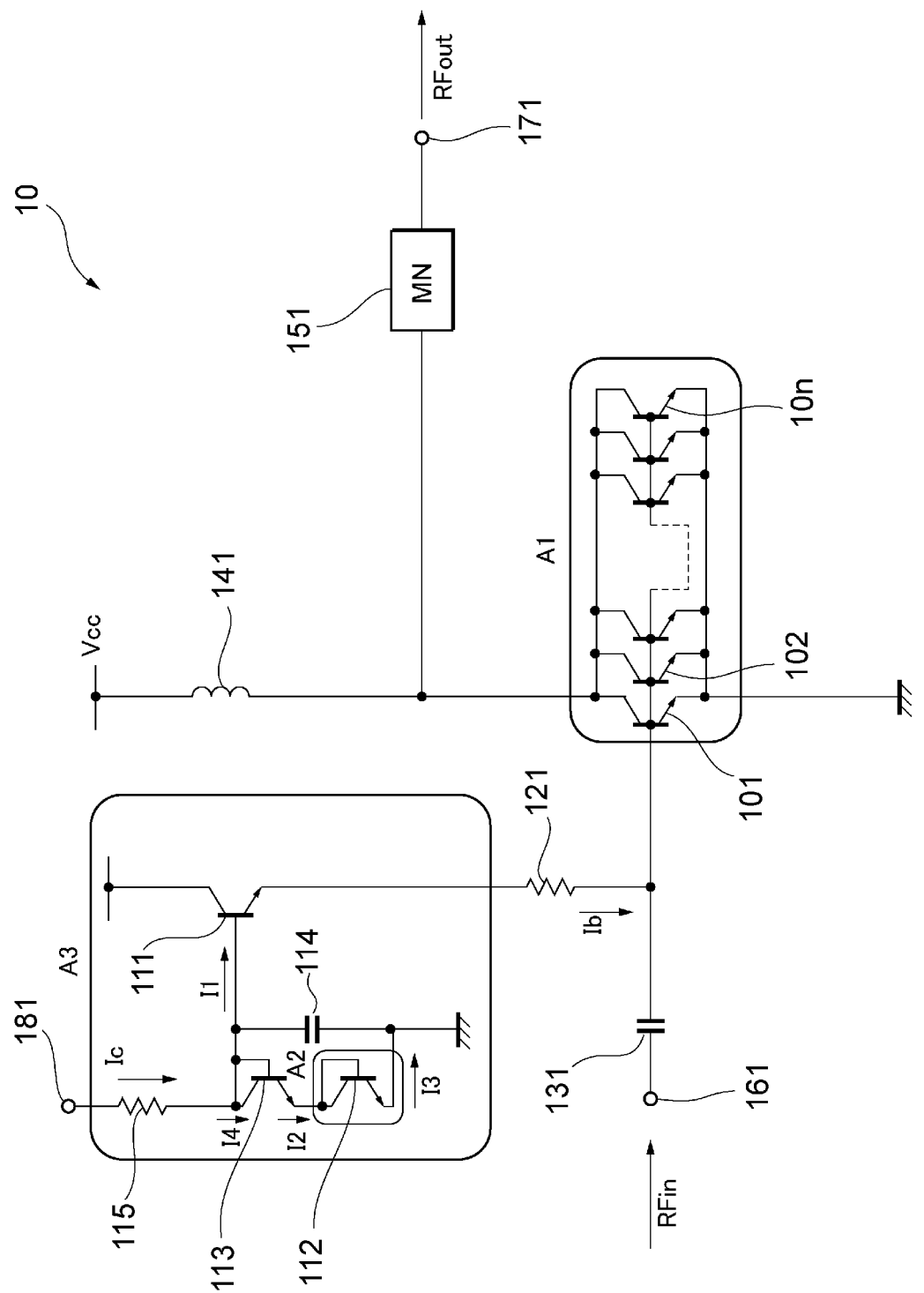
FIG. 1 is a circuit diagram of a power amplifier circuit according to a first embodiment.

Hereinafter, embodiments of the present disclosure will be described in detail with reference to the drawings. The same elements will be denoted by the same reference numerals, and a duplicate description will be omitted as much as possible.

A power amplifier circuit 10 according to a first embodiment will be described. FIG. 1 illustrates a circuit diagram of the power amplifier circuit 10. The power amplifier circuit 10 includes transistors 101 to 10$n$, 111, 112, and 113, capacitors 114 and 131, resistance elements 115 and 121, an inductor 141, and a matching circuit 151. The transistors 101 to 10$n$, 111, 112, and 113 are transistors, such as heterojunction bipolar transistors (HBTs), for example.

The transistors 101 to 10$n$ are disposed in a disposition area A1 on a semiconductor substrate (not illustrated).

The transistors 101 to 10$n$, each has a base connected to the capacitor 131 and the resistance element 121, a collector connected to the matching circuit 151, and an emitter connected to ground. The collectors of the transistors 101 to 10$n$ are supplied with a power supply voltage Vcc through the inductor 141.

Each of the transistors 101 to 10$n$ (first transistor) amplifies a signal RFin input from an input terminal 161. Each of the transistors 101 to 10$n$ amplifies the signal RFin input to the base thereof on the basis of a bias current Ib output from the transistor 111 (second transistor), which will be described below. The signal RFin amplified by each transistor is output as a signal RFout through the matching circuit 151.

The transistors 111, 112, and 113, the capacitor 114, and the resistance element 115 are disposed in a disposition area A3 on the semiconductor substrate.

The transistor 111 (second transistor) has a base connected to the resistance element 115, a collector connected to a power supply, and an emitter connected to the resistance element 121. The transistor 111 is switched between an ON-state and an OFF-state by a current I1 supplied to the base thereof on the basis of a control current Ic supplied from a control input terminal 181 and flowing through the resistance element 115. In an ON-state, the transistor 111 outputs the bias current Ib.

The transistor 112 (current output element) is a diode-connected transistor and has a collector connected to an emitter of the transistor 113 and an emitter connected to ground. The collector of the transistor 112 is supplied with a current I2. The transistor 112 outputs a current I3 from the emitter on the basis of the current I2. The transistor 112 is disposed in a disposition area A2 on the semiconductor substrate.

The transistor 113 (third transistor) is a diode-connected transistor and has a collector connected to the resistance element 115 and the base of the transistor 111 and an emitter connected to the collector of the transistor 112. The transistor 113 outputs the current I2 to the collector of the transistor 112 on the basis of a current I4 flowing through the collector thereof on the basis of the control current Ic.

The capacitor 114 has one end connected to the base of the transistor 111 and the other end connected to ground. The capacitor 114 functions to cause an alternating-current component of the control current Ic to flow to ground. The resistance element 115 is disposed to cause a predetermined voltage drop based on the control current Ic input from the control input terminal 181.

The transistors 111, 112, and 113, the capacitor 114, and the resistance element 115 constitute a bias circuit.

The matching circuit 151 has one end connected to the collectors of the transistors 101 to 10$n$ and the other end connected to an output terminal 171. The matching circuit 151 achieves impedance matching between the collectors of the transistors 101 to 10$n$ and the output terminal 171.

Figure 2:
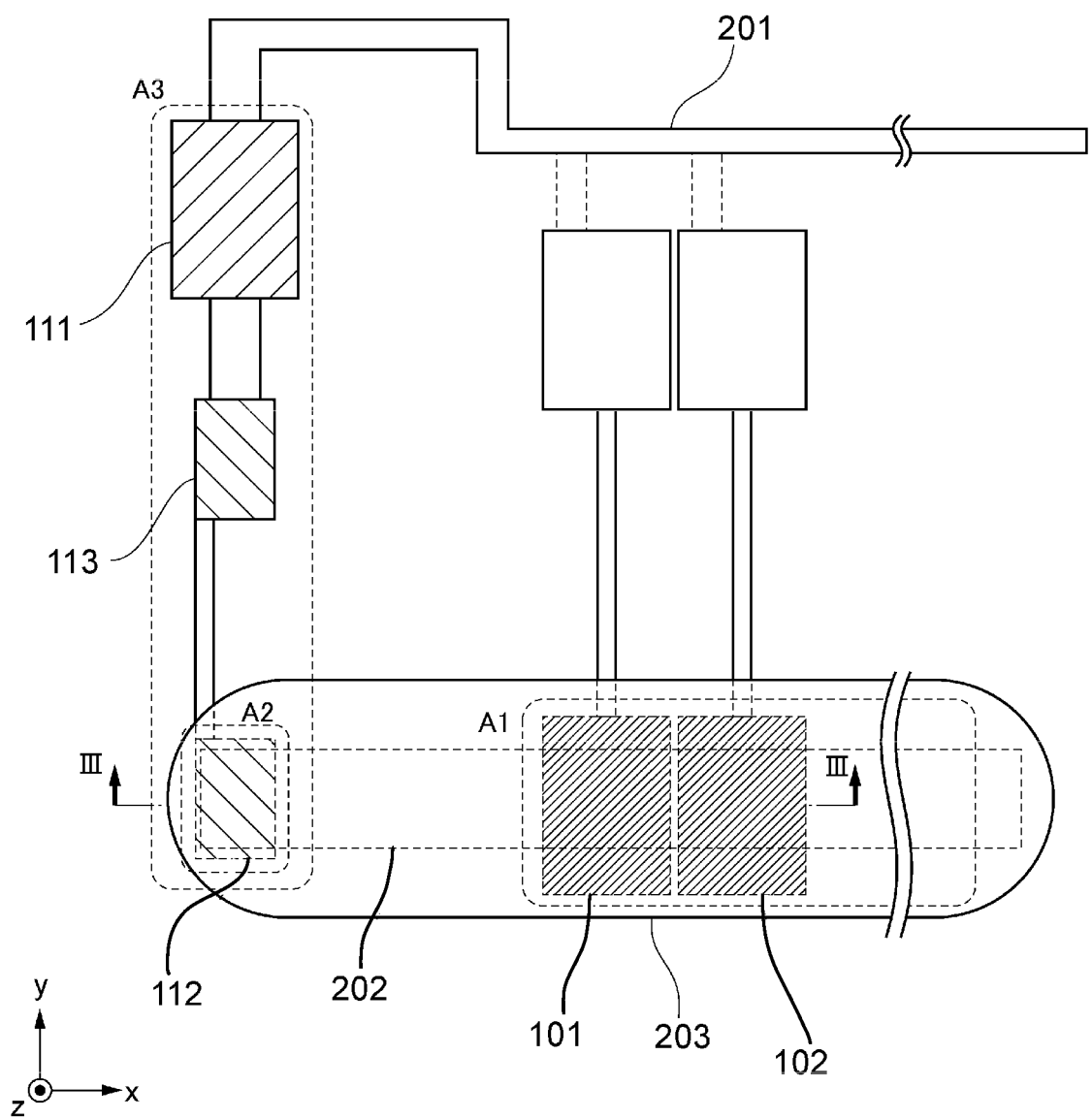
FIG. 2 is a layout diagram of the power amplifier circuit according to the first embodiment.

The layout of the power amplifier circuit 10 according to the first embodiment on the semiconductor substrate will be described with reference to FIG. 2. FIG. 2 schematically illustrates the transistors 101, 102, 111, 112, and 113. The transistors 101 and 102 are supplied with a bias current from the transistor 111 through a power supply wiring line 201. The transistors 101 and 102 are also supplied with the signal RFin input from the input terminal 161, which is not illustrated here, through the power supply wiring line 201.

The transistors 101 and 102 are arranged in a direction along an x-axis in the coordinate system in FIG. 2. In the power amplifier circuit 10, the plurality of transistors 103 to 10$n$, which are not illustrated here, are also arranged in the x-axis direction.

The transistor 112 is disposed along a direction in which the transistors 101 to 10$n$ are arranged. The transistor 113 and the transistor 111 are disposed at positions away from the transistor 112 in a y-axis direction.

The disposition area A1 is an internal area surrounded by the boundary of an isolation area that is disposed to electrically insulate, on the semiconductor substrate, the transistors 101 to 10$n$ from the other active devices disposed on the semiconductor substrate.

In a case where isolation areas are disposed for the individual transistors 101 to 10$n$, the disposition area A1 is defined by the envelopes of the individual isolation areas so as to include the isolation areas of the individual transistors 101 to 10$n$.

The disposition area A3 is based on an isolation area that is disposed to electrically insulate, on the semiconductor substrate, a plurality of active elements for supplying the bias current Ib to the transistors 101 to 10$n$ from the other active elements. The disposition area A3 is an internal area enveloping, with straight lines parallel to the x-axis and the y-axis, the outermost sides in the x-axis direction and the y-axis direction of the boundaries between the individual active elements and the isolation area.

The disposition area A2 is, similarly to the disposition areas A1 and A3, an internal area surrounded by the boundary of an isolation area that is disposed to insulate, on the semiconductor substrate, the transistor 112 from the other active elements.

A second emitter wiring line 202 is disposed above the transistors 101 to 10$n$ and the transistor 112 so as to be connected to the transistors 101 to 10$n$ and the transistor 112. The second emitter wiring line 202 extends so as to overlap an area extending from the disposition area A1 to the disposition area A2. That is, the second emitter wiring line 202 extends in the x-axis direction.

A bump 203 is disposed along the second emitter wiring line 202 so as to cover the transistors 101 to 10n and the transistor 112. The bump 203 extends so as to overlap an area extending from the disposition area A1 to the disposition area A2. That is, the bump 203 extends in the x-axis direction. The bump 203 is a copper pillar bump, for example.

In the layout illustrated in FIG. 2, it is sufficient that the bump 203 be disposed so as to cover the transistors 101 to 10n and the transistor 112. The arrangement direction of the transistors 101 to 10n and the positions of the transistors 111, 112, and 113 are not limited to those in the layout illustrated in FIG. 2.

Other layout examples are illustrated in FIG. 4 to FIG. 7. The layout diagrams in FIG. 4 to FIG. 7 illustrate variations of the disposition areas based on the relationship between the individual transistors and the isolation areas of the individual transistors. In FIG. 4 to FIG. 7, a semiconductor substrate 301 has an isolation area Bl, and the relationships between the isolation area Bl and the disposition areas A1 to A3 are illustrated.

Figure 3:
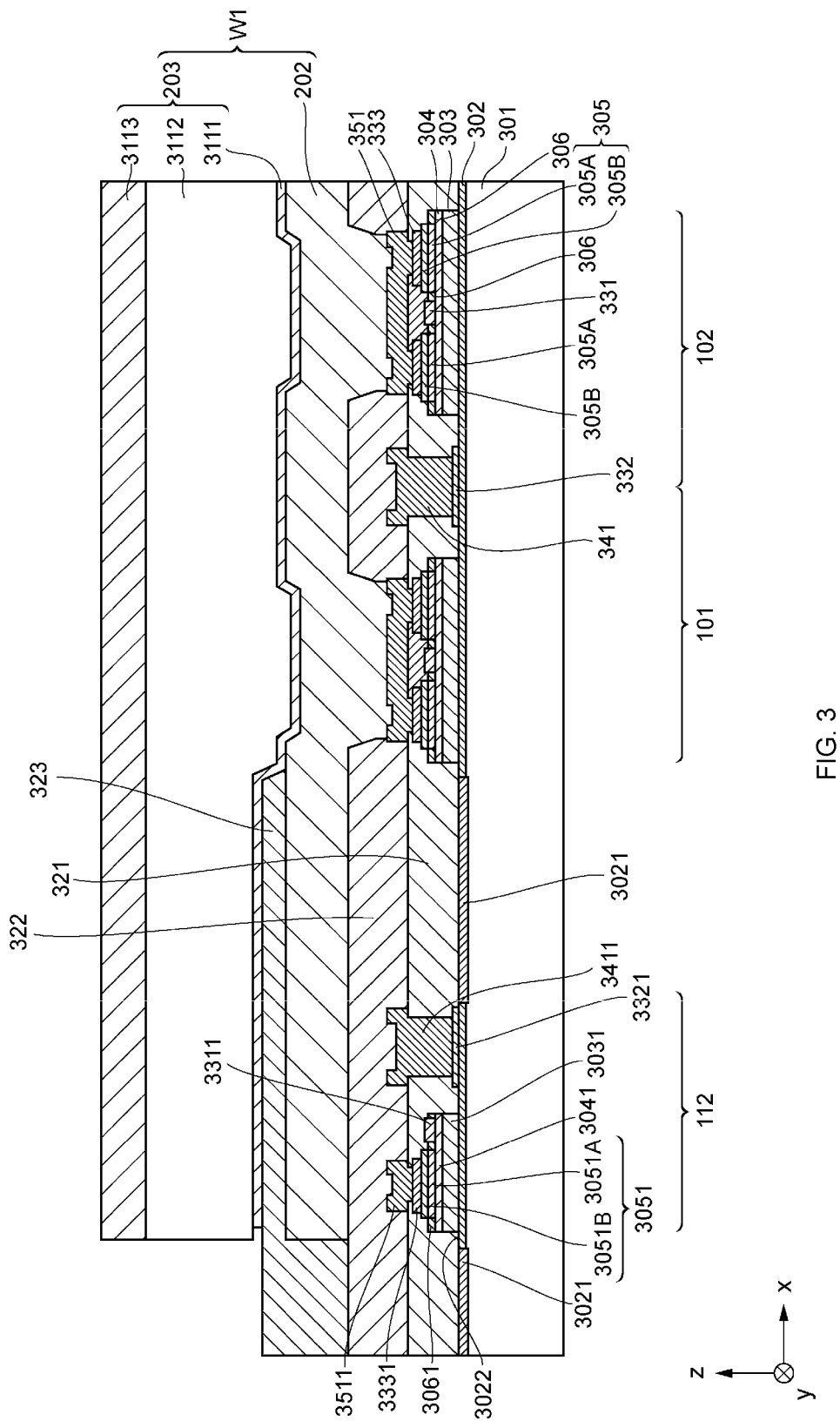
FIG. 3 is a cross-sectional view taken along line III-III in FIG. 2.
Figure 4:
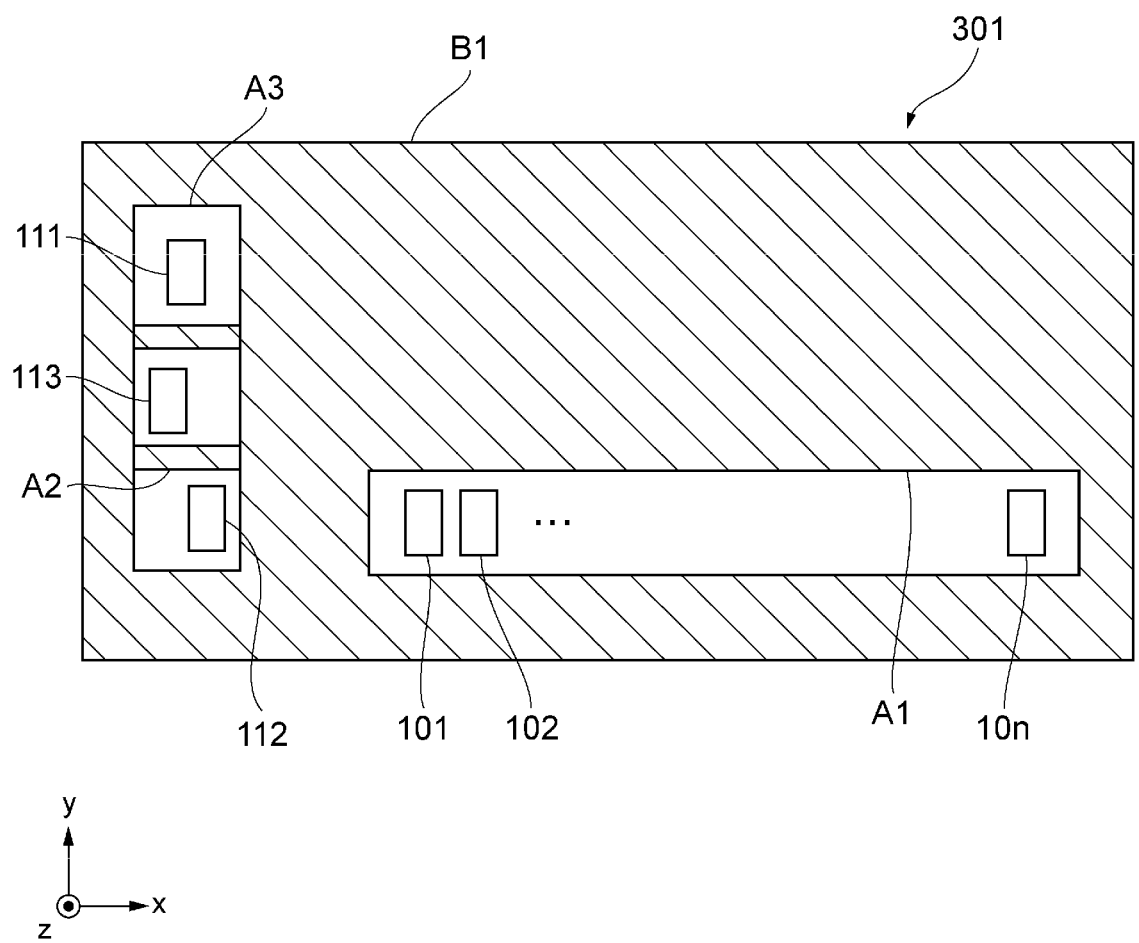
FIG. 4 is a schematic view of another layout of the power amplifier circuit according to the first embodiment.
Figure 5:
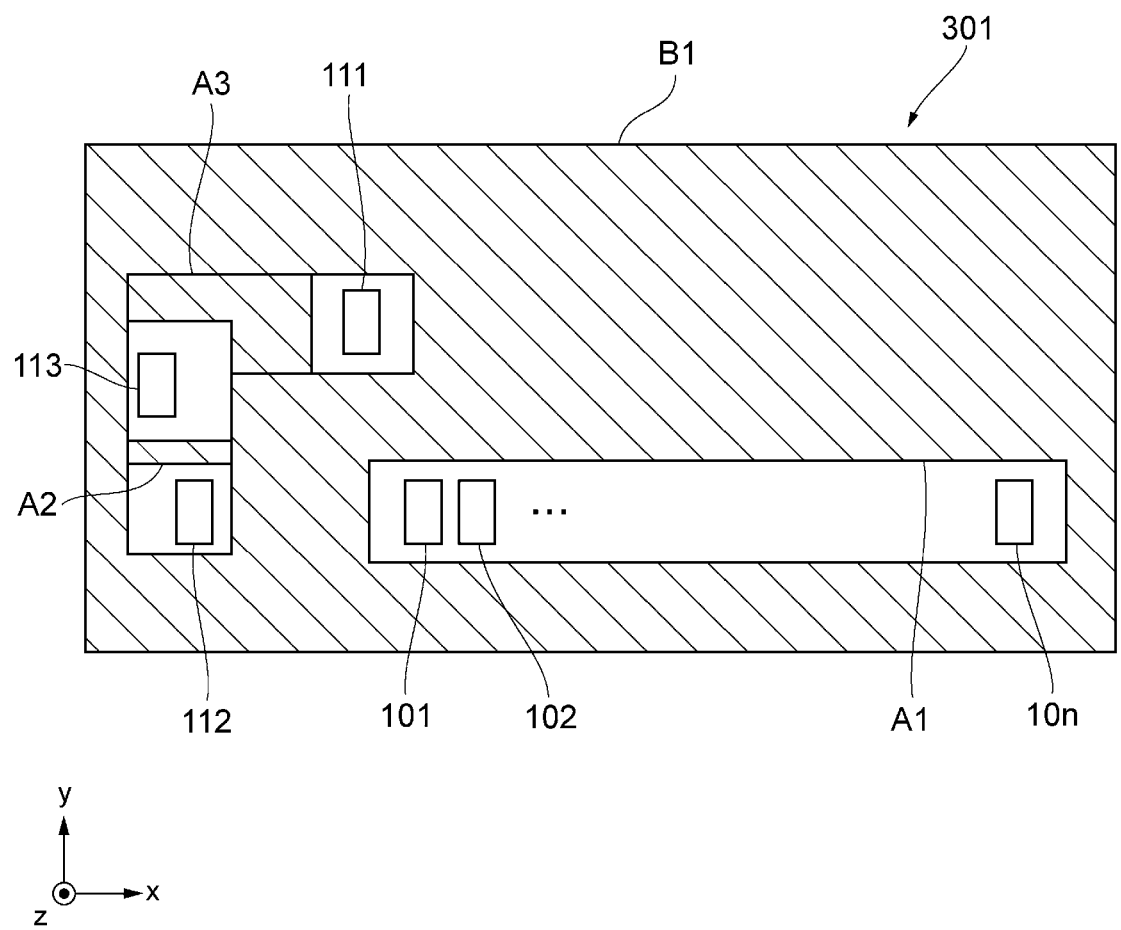
FIG. 5 is a schematic view of another layout of the power amplifier circuit according to the first embodiment.
Figure 6:
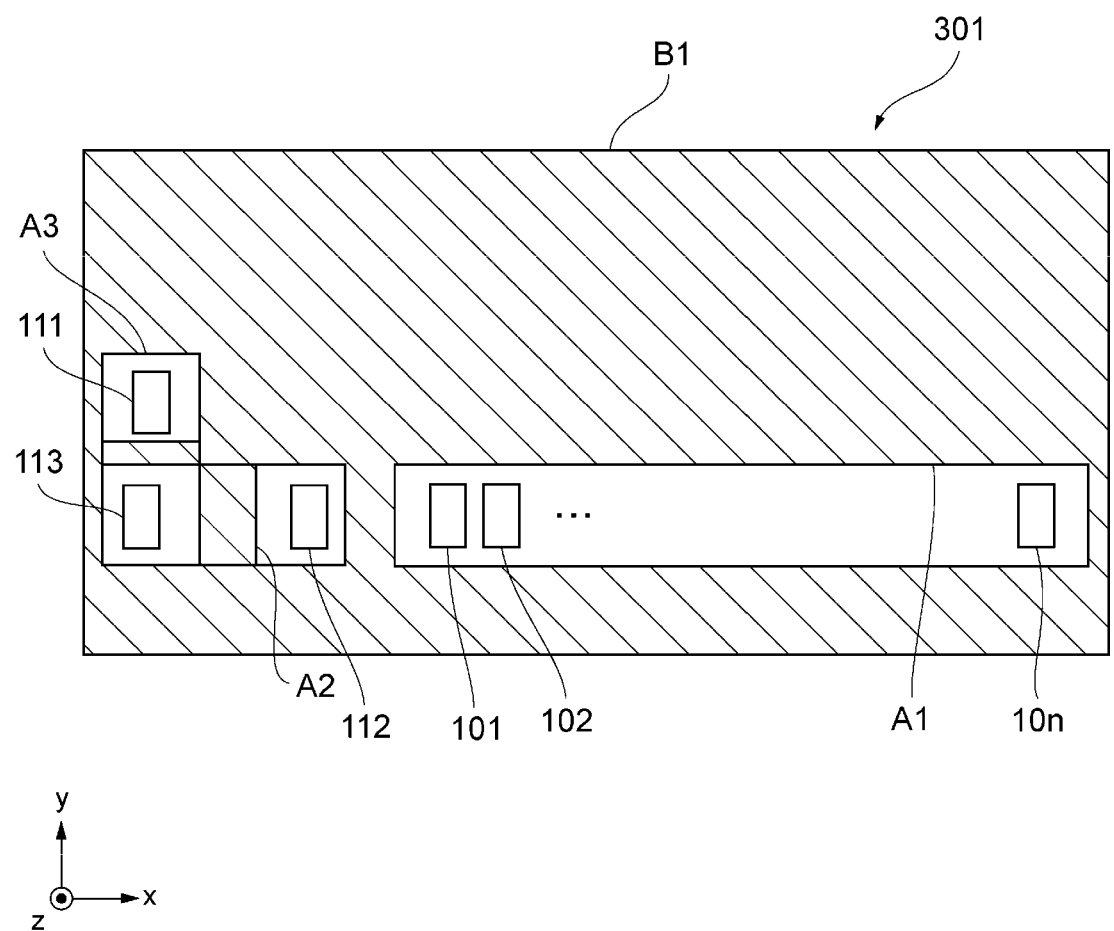
FIG. 6 is a schematic view of another layout of the power amplifier circuit according to the first embodiment.
Figure 7:
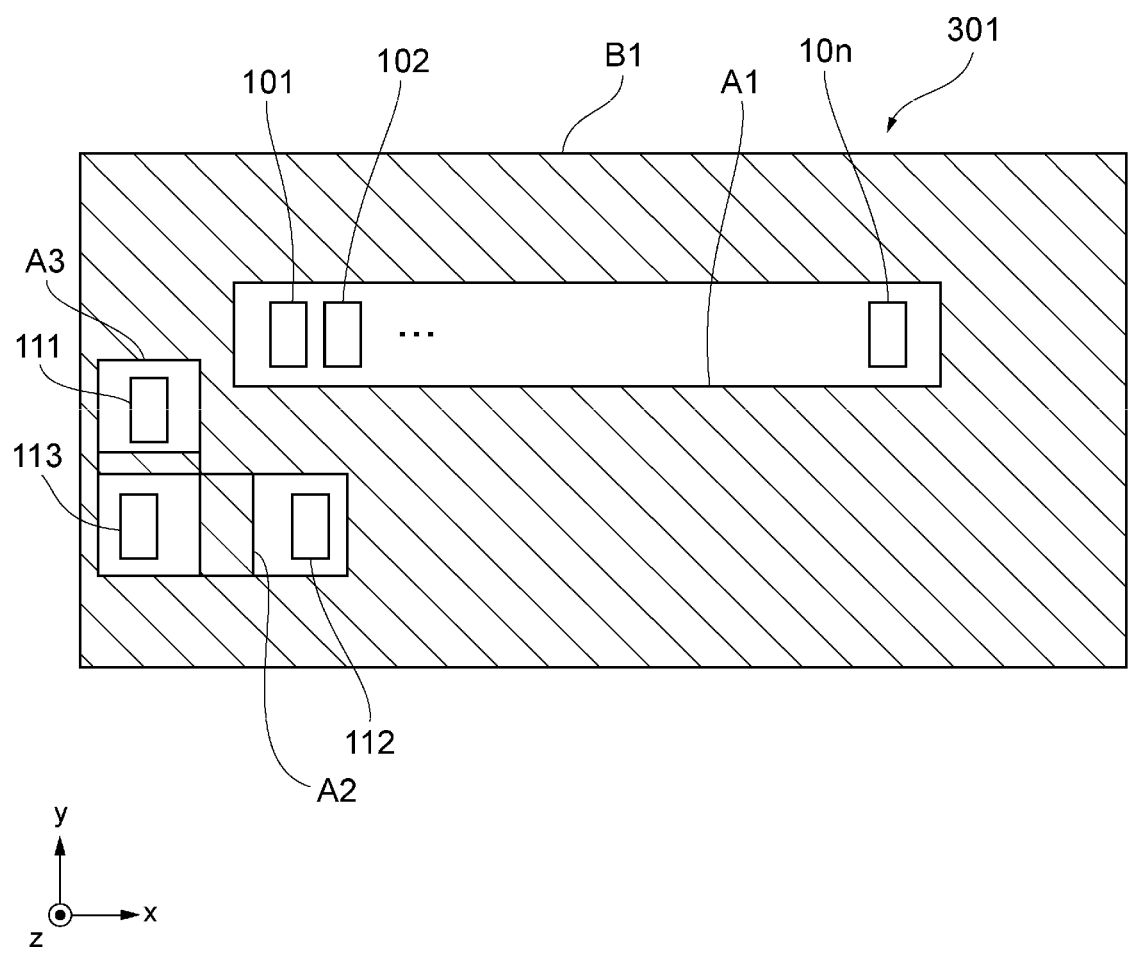
FIG. 7 is a schematic view of another layout of the power amplifier circuit according to the first embodiment.

The cross-sectional structure of the power amplifier circuit 10 will be described with reference to FIG. 3.

The transistors 101 and 102 will be described. The transistors 101 and 102 are disposed on the semiconductor substrate 301. A detailed structure will be described about the transistor 102. A sub-collector layer 302 is disposed on the semiconductor substrate 301. The semiconductor substrate 301 is made of, for example, semi-insulating GaAs. The sub-collector layer 302 is made of, for example, high-concentration n-type GaAs. The sub-collector layer 302 has a thickness of about 0.5 µm, for example.

A collector layer 303 is disposed on the sub-collector layer 302. The collector layer 303 is made of, for example, n-type GaAs. The collector layer 303 has a thickness of about 1 µm, for example. A base layer 304 is disposed on the collector layer 303. The base layer 304 is made of, for example, p-type GaAs. The base layer 304 has a thickness of about 100 nm, for example.

An emitter layer 305 is disposed on the base layer 304. The emitter layer 305 includes an intrinsic emitter layer 305A and an emitter mesa layer 305B. The intrinsic emitter layer 305A is disposed on the base layer 304. The emitter mesa layer 305B is disposed on the intrinsic emitter layer 305A. The intrinsic emitter layer 305A is made of, for example, n-type InGaP. The intrinsic emitter layer 305A has a thickness of about 30 nm or more and about 40 nm or less, for example. The emitter mesa layer 305B is made of, for example, high-concentration n-type GaAs and high-concentration n-type InGaAs. In the emitter mesa layer 305B, for example, a high-concentration n-type InGaAs layer having a thickness of about 100 nm is disposed on a high-concentration n-type GaAs layer having a thickness of about 100 nm.

A ledge layer 306 is disposed on an upper surface of the base layer 304, in an area in which the emitter layer 305 is not disposed. The ledge layer 306 is deposited together with the intrinsic emitter layer 305A and has the same composition as that of the intrinsic emitter layer 305A. Because the emitter mesa layer 305B is not disposed on the ledge layer 306, the ledge layer 306 is depleted and thus does not function as an emitter of the transistor. Thus, the intrinsic emitter layer 305A and the emitter mesa layer 305B are referred to as the emitter layer 305, and the ledge layer 306 is distinguished from the emitter layer 305.

The collector layer 303, the base layer 304, and the emitter layer 305 constitute the transistor 102. The same applies to the transistor 101.

A base electrode 331 is disposed on the base layer 304. The base electrode 331 is in ohmic contact with the base layer 304 through a cavity disposed in the ledge layer 306. The base electrode 331 is disposed between portions of the emitter layer 305 in each of the transistors 101 and 102.

A collector electrode 332 is disposed on the sub-collector layer 302. The collector electrode 332 is in ohmic contact with the sub-collector layer 302. The collector electrode 332 is disposed between the transistor 101 and the transistor 102 in the x-axis direction. The collector electrode 332 is connected to the collector layer 303 via the sub-collector layer 302. The collector electrode 332 is shared between the transistor 101 and the transistor 102.

An emitter electrode 333 is disposed on the emitter layer 305. The emitter electrode 333 is in ohmic contact with the emitter layer 305.

The base electrode 331 is formed by stacking, for example, a Ti film, a Pt film, and a Au film in order on the base layer 304. The collector electrode 332 is formed by stacking, for example, a AuGe film, a Ni film, and a Au film in order on the sub-collector layer 302. The emitter electrode 333 is formed of, for example, a Ti film having a thickness of about 50 nm.

In the sub-collector layer 302, an isolation area 3021 for isolating elements from each other is disposed. The isolation area 3021 is formed by insulating a part of the sub-collector layer 302 by using, for example, an ion implantation technique. A part of the sub-collector layer 302 is a part in an x-y plane. The isolation area 3021 is disposed over the entire part in a z-axis direction of the sub-collector layer 302. The isolation area 3021 may be disposed so as to include a part of the semiconductor substrate 301 in addition to the sub-collector layer 302 in the z-axis direction.

The transistor 112 will be described. A sub-collector layer 3022 is disposed on the semiconductor substrate 301. A collector layer 3031 is disposed on the sub-collector layer 3022. A base layer 3041 is disposed on the collector layer 3031. An emitter layer 3051 and a ledge layer 3061 are disposed on the base layer 3041. The emitter layer 3051 includes an intrinsic emitter layer 3051A and an emitter mesa layer 3051B. The relationship among the intrinsic emitter layer 3051A, the emitter mesa layer 3051B, and the ledge layer 3061 is similar to the relationship among the intrinsic emitter layer 305A, the emitter mesa layer 305B, and the ledge layer 306.

The collector layer 3031, the base layer 3041, and the emitter layer 3051 constitute the transistor 112.

The transistor 112 is formed by the same process as the process of forming the transistors 101 and 102. Thus, the transistor 112 has temperature characteristics similar to those of the transistors 101 and 102.

A base electrode 3311 is disposed on the base layer 3041. The base electrode 3311 is in ohmic contact with the base layer 3041 through a cavity disposed in the ledge layer 3061. A collector electrode 3321 is disposed on the sub-collector layer 3022. The collector electrode 3321 is in ohmic contact with the sub-collector layer 3022. The collector electrode 3321 is connected to the collector layer 3031 via the sub-collector layer 3022. An emitter electrode 3331 is disposed on the emitter layer 3051. The emitter electrode 3331 is in ohmic contact with the emitter layer 3051.

The base electrode 3311, the collector electrode 3321, and the emitter electrode 3331 are formed by the same processes as the processes of forming the base electrode 331, the collector electrode 332, and the emitter electrode 333, respectively.

A first insulating layer 321 is disposed so as to cover the transistors 101, 102, and 112. The first insulating layer 321 has a multilayer structure formed of, for example, a SiN layer and a resin layer. Alternatively, the first insulating layer 321 may be formed of only a SiN layer.

First-layer collector wiring lines 341 and 3411 are disposed on the first insulating layer 321. The first-layer collector wiring line 341 is disposed through the first insulating layer 321 and connected to the collector electrode 332. The first-layer collector wiring line 3411 is disposed through the first insulating layer 321 and connected to the collector electrode 3321.

First emitter wiring lines 351 and 3511 are disposed on the first insulating layer 321. The first emitter wiring line 351 is disposed for each of the transistors 101 and 102. The first emitter wiring line 351 connects the emitter electrodes 333 of each transistor. The first-layer collector wiring line 341 and the first emitter wiring line 351, each has a multilayer structure formed of, for example, a Ti film having a thickness of about 10 nm or more and about 50 nm or less and a Au film having a thickness of about 1 µm or more and about 2 µm or less. The first emitter wiring line 3511 is disposed for the transistor 112. The material and structure of the first emitter wiring line 3511 are similar to those of the first emitter wiring line 351.

A second insulating layer 322 is disposed on the first insulating layer 321 so as to cover the first-layer collector wiring lines 341 and 3411 and the first emitter wiring lines 351 and 3511. The second insulating layer 322 has a multilayer structure formed of, for example, a SiN layer and a resin layer. Alternatively, the second insulating layer 322 may be formed of only a SiN layer.

A second emitter wiring line 202 is disposed on the second insulating layer 322. The second emitter wiring line 202 is connected to the first emitter wiring lines 351 through cavities disposed in the second insulating layer 322. The first emitter wiring lines 351 of the transistors 101 and 102 arranged in the x-axis direction are connected to each other via the second emitter wiring line 202. The second emitter wiring line 202 has a multilayer structure formed of, for example, a Ti film having a thickness of about 10 nm or more and about 50 nm or less and a Au film having a thickness of about 2 µm or more and about 4 µm or less. The second emitter wiring line 202 extends to a position above the transistor 112.

A third insulating layer 323 is disposed on the second emitter wiring line 202 so as to cover the second emitter wiring line 202. The third insulating layer 323 has a multilayer structure formed of, for example, a SiN film and a resin film. Alternatively, the third insulating layer 323 may be formed of only a SiN film. The third insulating layer 323 functions as a protective film that protects the transistors 101, 102, and 112.

The bump 203 is disposed on the third insulating layer 323. The bump 203 is connected to the second emitter wiring line 202 through a cavity of the third insulating layer 323. The bump 203 has a multilayer structure in which an under bump metal layer 3111, a metal post 3112, and a solder layer 3113 are stacked in this order.

The under bump metal layer 3111 is formed of, for example, a Ti film having a thickness of about 50 nm or more and about 100 nm or less. The under bump metal layer 3111 has a function of increasing adhesion of the bump 203 to the third insulating layer 323.

The metal post 3112 is formed of, for example, a Cu film having a thickness of about 30 µm or more and about 50 µm or less. The solder layer 3113 is formed of, for example, a film made of Sn or a SnAg alloy and having a thickness of about 10 µm or more and about 30 µm or less.

Alternatively, a barrier metal layer made of Ni or the like and preventing mutual diffusion may be disposed between the metal post 3112 and the solder layer 3113.

The bump 203 functions as a metal member for dissipating heat generated by the transistors 101 and 102 to the outside.

The second emitter wiring line 202 and the bump 203, which are two metal layers, constitute a wiring portion W1. The second emitter wiring line 202 and the bump 203 are members having different shapes.

The movement of heat generated by the transistors 101 and 102 and thermal coupling will be described.

The transistors 101 and 102 generate heat when operating. The transistors 101 and 102 operate as a result of being supplied with the bias current Ib from the transistor 111.

In the transistors 101 and 102, an operating current flows from the collector layer 303 through the base layer 304 to the emitter layer 305. In the collector layer 303, the base layer 304, and the emitter layer 305, the area through which the operating current substantially flows substantially matches the emitter layer 305 in plan view. The flow of the operating current in the collector layer 303, the base layer 304, and the emitter layer 305 generates Joule heat, which increases the temperatures of the transistors 101 and 102.

The heat generated in the transistors 101 and 102 is transmitted to the second emitter wiring line 202 through the emitter electrodes 333. The heat transmitted to the second emitter wiring line 202 is transmitted in the second emitter wiring line 202 in the x-axis direction and the z-axis direction.

The heat transmitted from the second emitter wiring line 202 in the z-axis direction reaches the bump 203. The heat reached the bump 203 is transmitted in the x-axis direction and the z-axis direction. In a case where a semiconductor chip including the power amplifier circuit 10 is flip-chip connected, the heat transmitted in the z-axis direction in the bump 203 is transmitted to the substrate on which the semiconductor chip is installed.

The heat transmitted in the x-axis direction in the second emitter wiring line 202 increases the temperature of the second emitter wiring line 202 above the transistor 112. The heat transmitted in the x-axis direction in the bump 203 increases the temperature of the bump 203 above the transistor 112. The increase in the temperatures of the second emitter wiring line 202 and the bump 203 near a position above the transistor 112 causes an increase in the temperature of the transistor 112 as a result of heat conduction in the z-axis direction.

If the second emitter wiring line 202 and the bump 203 do not extend to the vicinity of a position above the transistor 112, heat conduction from the second emitter wiring line 202 and the bump 203 to the transistor 112 does not sufficiently occur. In this case, the amount of increase in the temperature of a transistor of the bias circuit is smaller than the amount of increase in the temperature of the transistor 112.

Such a relationship between the transistor 112 and the transistors 101 and 102, that is, a phenomenon in which a change in the temperature of a first element causes the temperature of a second element to change to approach the temperature of the first element, is referred to as thermal coupling. In the power amplifier circuit 10, the temperature of the transistor 112 changes to become closer to the temperature of the transistors 101 and 102 compared to the case where the second emitter wiring line 202 and the bump 203 do not extend to the vicinity of a position above the transistor 112. In other words, the strength of the thermal coupling between the transistor 112 and the transistors 101 and 102 increases.

The operations of the circuit will be described also with reference to FIG. 1. The operations of the transistors 101 to 10n cause an increase in the temperatures of the transistors 101 to 10n. The increase in the temperatures of the transistors 101 to 10n causes an increase in the collector currents of the transistors 101 to 10n. In accordance with the increase in the collector currents, the gains of the transistors 101 to 10n increase.

The heat generated by the transistors 101 to 10n causes an increase in the temperature of the transistor 112 via the second emitter wiring line 202 and the bump 203. The increase in the temperature of the transistor 112 causes a decrease in the forward voltage of the transistor 112 serving as a diode. The decrease in the forward voltage causes in an increase in the current I2 and the current I3. The increase in the current I2 and the current I3 causes a decrease in the current I1, which is the base current of the transistor 111.

The decrease in the current I1 causes a decrease in the bias current Ib output from the transistor 111. The decrease in the bias current Ib causes a decrease in the current supplied to the bases of the transistors 101 to 10n and thus causes a decrease in the collector currents of the transistors 101 to 10n. The power amplifier circuit 10 is capable of decreasing the collector currents more than in the case where thermal coupling is insufficient. As a result of suppressing more an increase in the collector currents, variations in gain, including an increase in gain, of the transistors 101 to 10n can be suppressed more.

The transistor 112 serving as a current output element may be replaced with a diode in which the forward voltage decreases and the current I2 increases in accordance with a rise in temperature. As the current output element, any element may be used as long as the current I2 increases in accordance with a rise in temperature.

Figure 8:
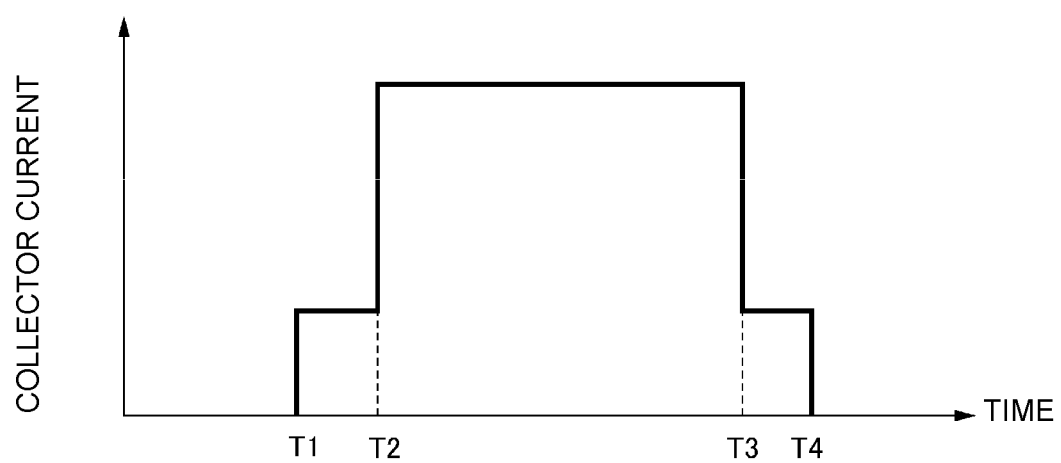
FIG. 8 is a graph for describing an example of an operation of the power amplifier circuit.

An example will be given regarding suppression of variations in gain by the power amplifier circuit 10. FIG. 8 illustrates chronological changes in the collector current of a transistor that performs an intermittent operation. The intermittent operation means an operation of causing, in addition to a signal amplified by the transistor, such as the one illustrated between time T2 and time T3, an idle current flowing when the transistor is in an OFF-state, to rise and fall immediately before input of the signal.

During the intermittent operation, the idle current changes in the following manner. At time T1, the idle current enters an ON-state. At time T2, the amplified signal enters an ON-state in addition to the idle current. At time T3, the amplified signal enters an OFF-state. At time T4, the idle current enters an OFF-state.

In the transistor that performs such an intermittent operation, heat generation after time T2 may cause variations in gain. In the power amplifier circuit 10, the balance in temperature between the transistor 112 and the transistors 101 to 10n is achieved by the second emitter wiring line 202 and the bump 203, and thus an increase in gain can be suppressed.

Additionally, in the transistor that performs the intermittent operation, the amount of heat generation in the emitter significantly changes also before time T1 at which the idle current enters an ON-state and between time T1 and time T2, and thus the temperature changes. The change in temperature may cause variations in gain. Also, in this case, in the power amplifier circuit 10, the balance in temperature between the transistor 112 and the transistors 101 to 10n can be achieved and an increase in gain can be suppressed.

Also, in a case where a current changes to cause an increase in temperature as a result of an operation other than the intermittent operation, an increase in gain can be suppressed by achieving the balance in temperature between the transistor 112 and the transistors 101 to 10n.

Figure 9:
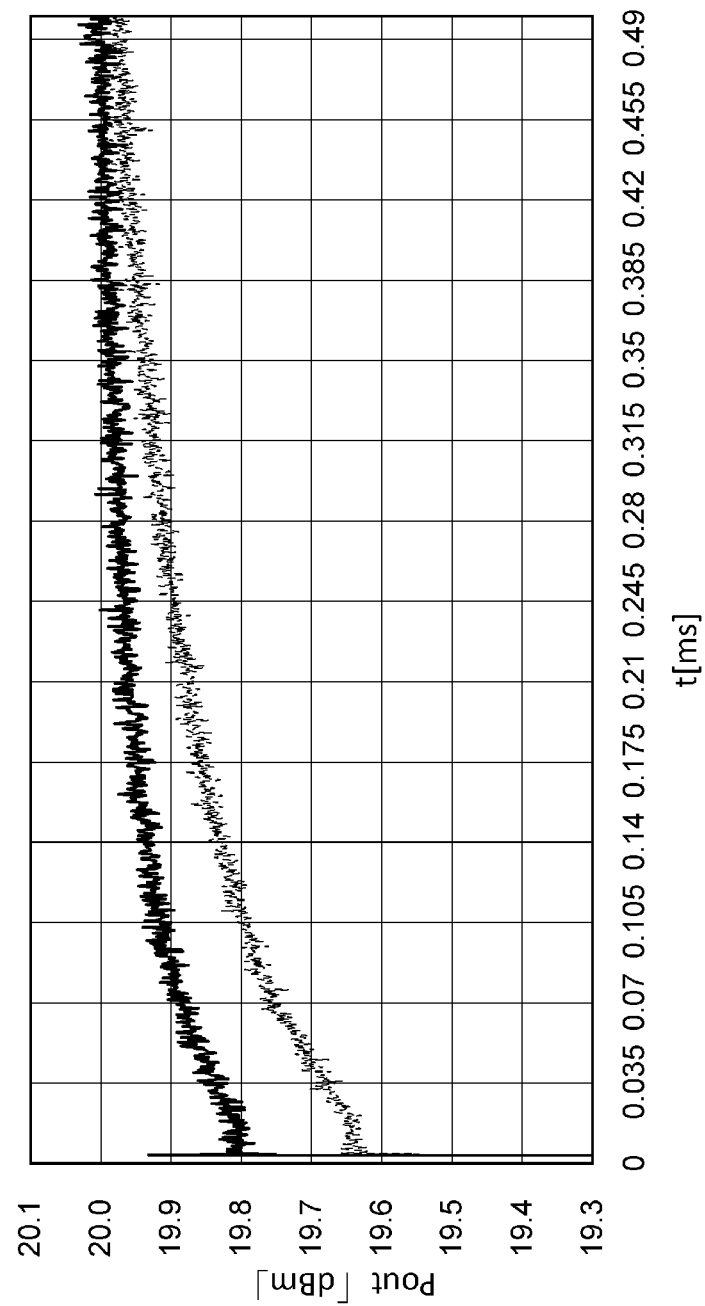
FIG. 9 is a graph for describing rises of outputs from the power amplifier circuit according to the first embodiment and a power amplifier circuit according to a comparative example.

FIG. 9 illustrates a comparison in performance between a power amplifier circuit having the configuration of the power amplifier circuit 10 and a power amplifier circuit (comparative example) in which the wiring portion W1 does not extend to the vicinity of a position above the transistor 112. In FIG. 9, the horizontal axis represents time t (ms) and the vertical axis represents output power Pout (dBm). An input signal has a frequency of about 3.75 GHz. FIG. 9 illustrates variations in the output power Pout until the output power Pout reaches 20 dBm, which is a target value. In the comparative example represented by a broken line in FIG. 9, the amount of variation in the output power Pout until 20 dBm is reached is about 0.4 dBm. In the power amplifier circuit 10 represented by a solid line in FIG. 9, the amount of variation in the output power Pout is about 0.2 dBm. In this way, in the power amplifier circuit 10, variations in gain resulting from variations in temperature is suppressed, and thus the amount of variation in the output power Pout is smaller than in the comparative example.

Figure 10:
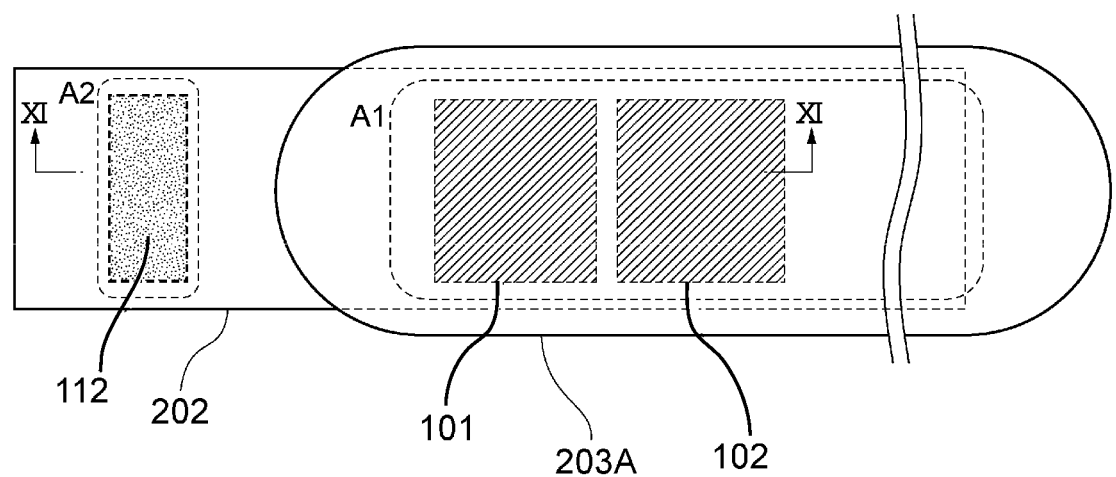
FIG. 10 is a layout diagram of a power amplifier circuit according to a modification example of the first embodiment.
Figure 11:
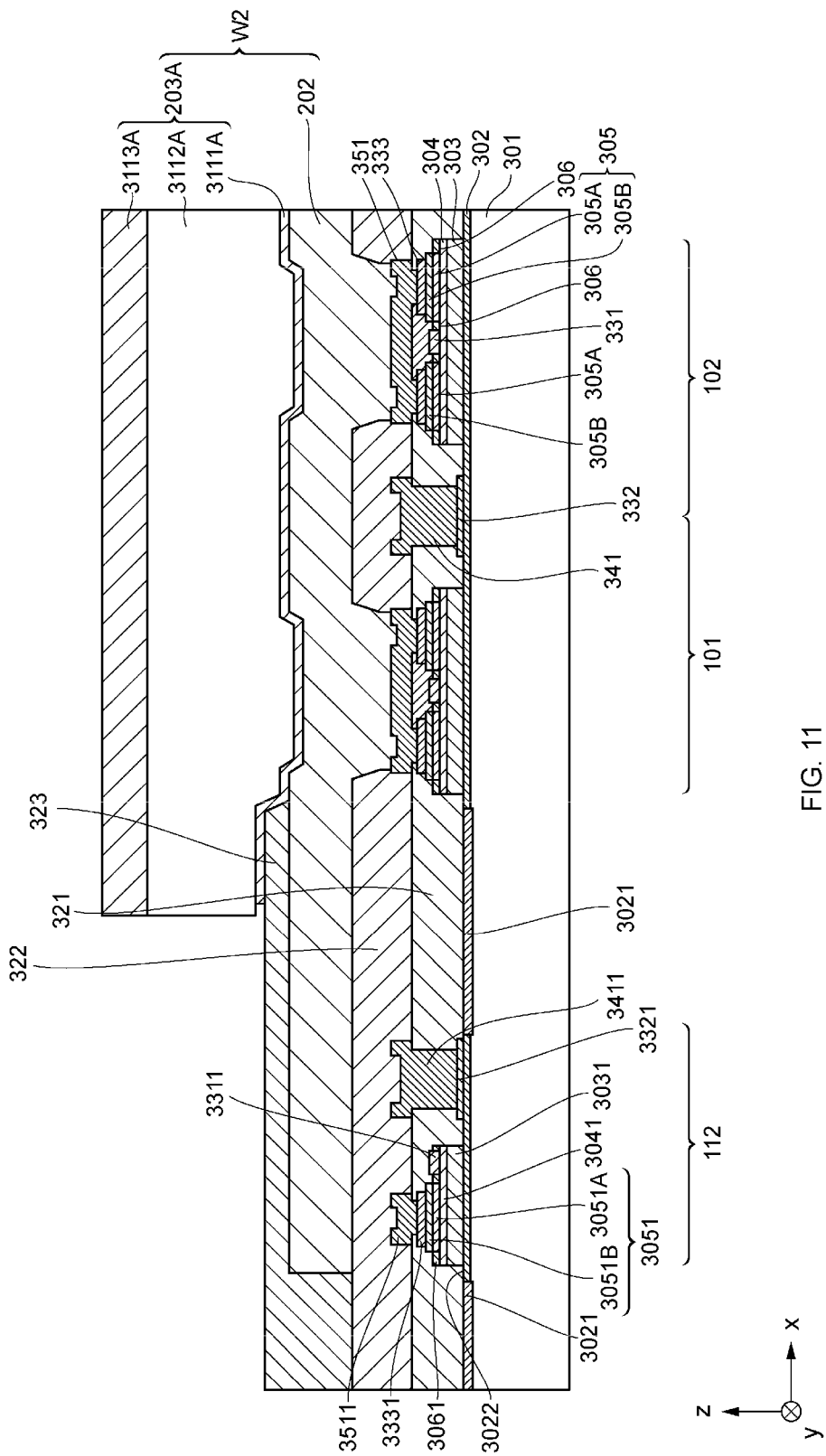
FIG. 11 is a cross-sectional view taken along line XI-XI in FIG. 10.

As illustrated in the layout diagram in FIG. 10 and the cross-sectional view in FIG. 11, the second emitter wiring line 202 and the bump 203 do not necessarily need to completely cover the disposition area A2 in which the transistor 112 is disposed. It is sufficient that the temperature state of the transistors disposed in the disposition area A1 be reflected in the transistor disposed in the disposition area A2 by the second emitter wiring line 202 and the bump 203.

In the layout diagram in FIG. 10 and the cross-sectional view in FIG. 11, the second emitter wiring line 202 reaches a position above the transistor 112 that is disposed in the disposition area A2, whereas a bump 203A, which includes an under bump metal layer 3111A, a metal post 3112A, and a solder layer 3113A, does not reach a position above the transistor 112. In this case, the second emitter wiring line 202 and the bump 203A, which are two metal layers, constitute a wiring portion W2.

Figure 12:
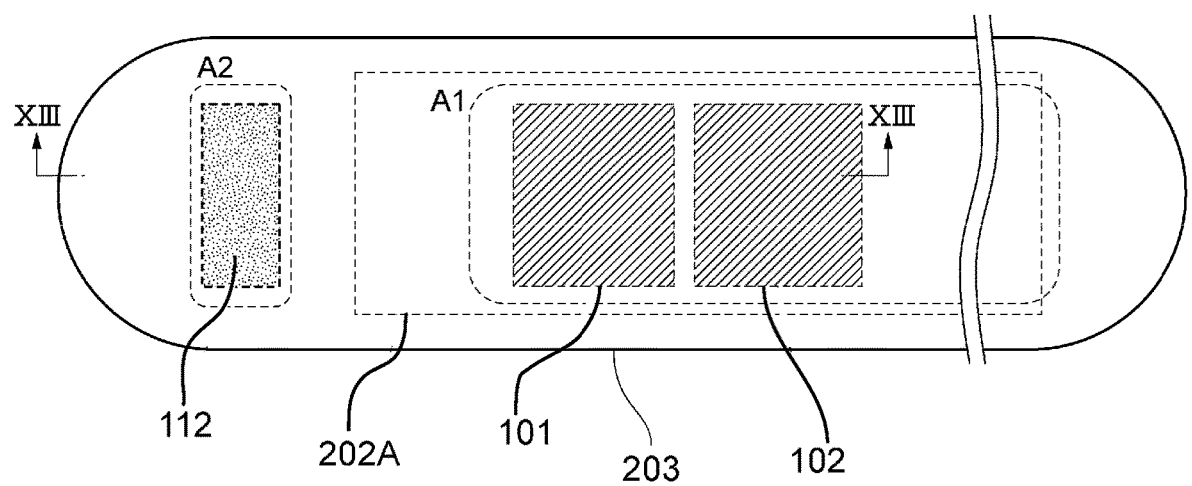
FIG. 12 is a layout diagram of a power amplifier circuit according to another modification example of the first embodiment.
Figure 12:
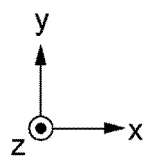
Figure 13:
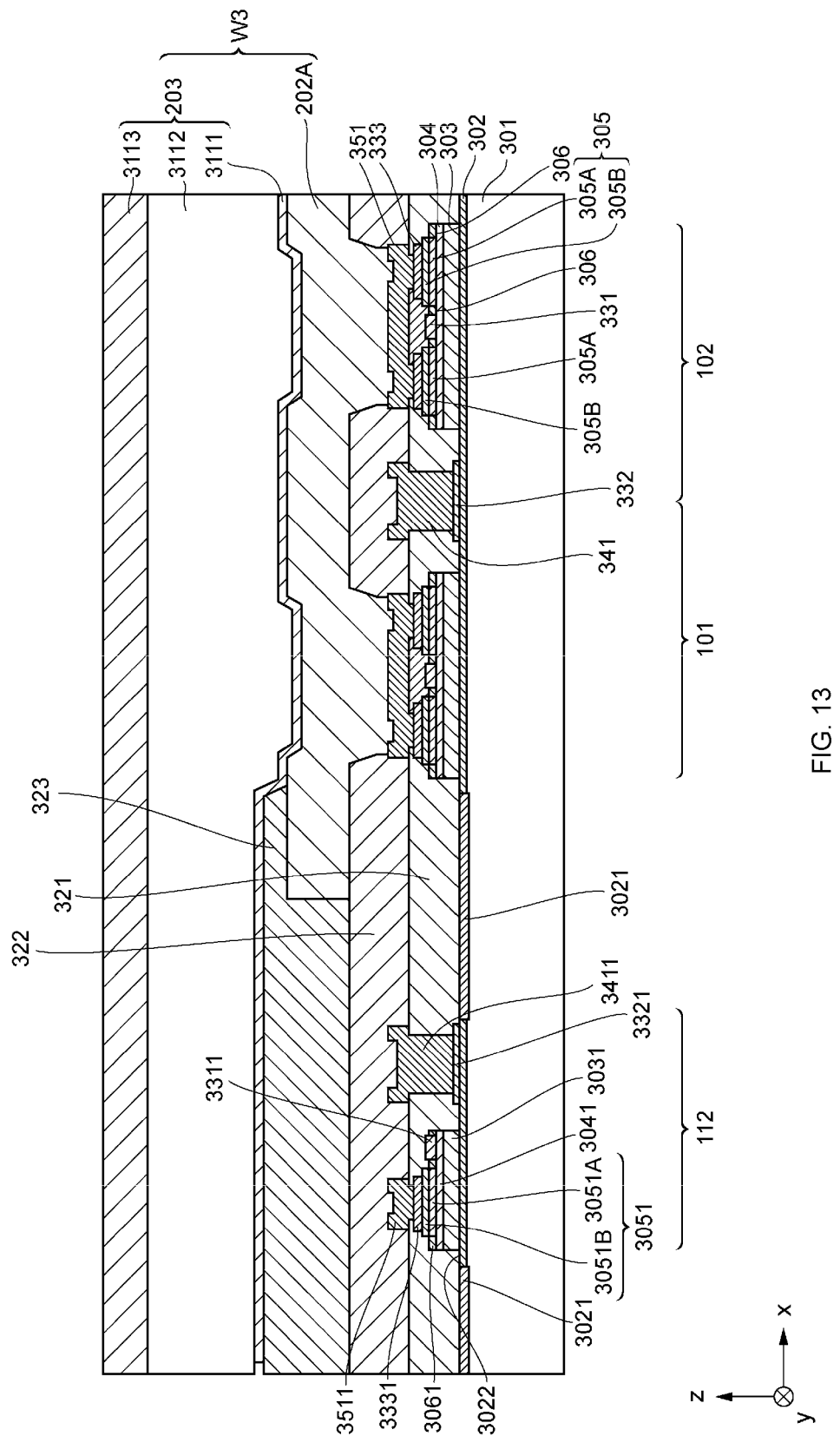
FIG. 13 is a cross-sectional view taken along line XIII-XIII in FIG. 12.

In the layout diagram in FIG. 12 and the cross-sectional view in FIG. 13, the bump 203 reaches a position above the transistor 112 that is disposed in the disposition area A2, whereas a second emitter wiring line 202A does not reach a position above the transistor 112. In this case, the second emitter wiring line 202A and the bump 203, which are two metal layers, constitute a wiring portion W3.

Figure 14:
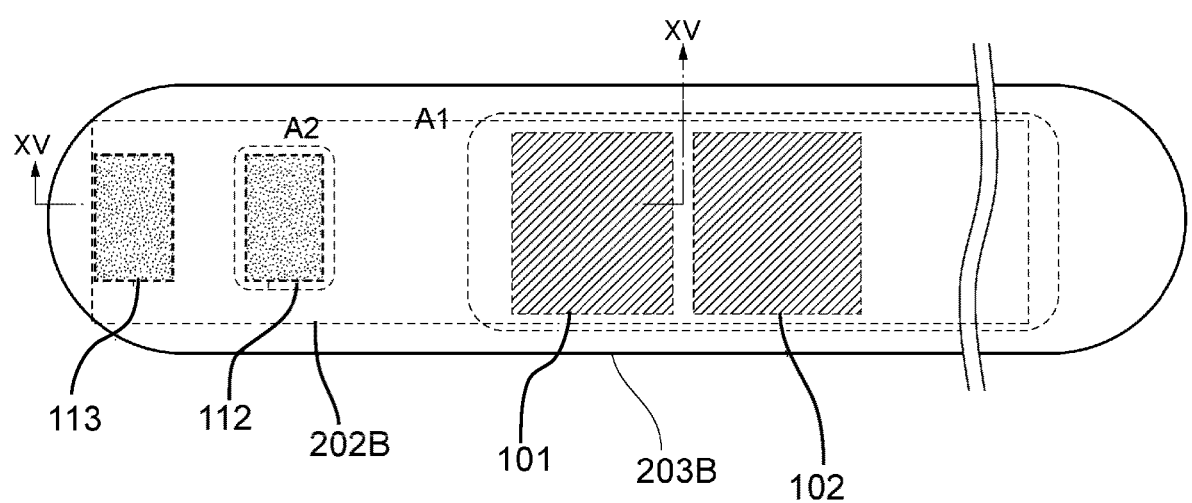
FIG. 14 is a layout diagram of a power amplifier circuit according to another modification example of the first embodiment.

The bump 203 may be disposed so as to overlap an area extending from the disposition area A1 to an area between the disposition area A1 and the disposition area A3 including the disposition area A2. More specifically, the second emitter wiring line 202 and the bump 203 may cover the transistors 111, 112, and 113 disposed in the disposition area A3. FIG. 14 illustrates a layout diagram in a case where a second emitter wiring line 202B and a bump 203B extend to a position above the transistor 113.

Figure 15:
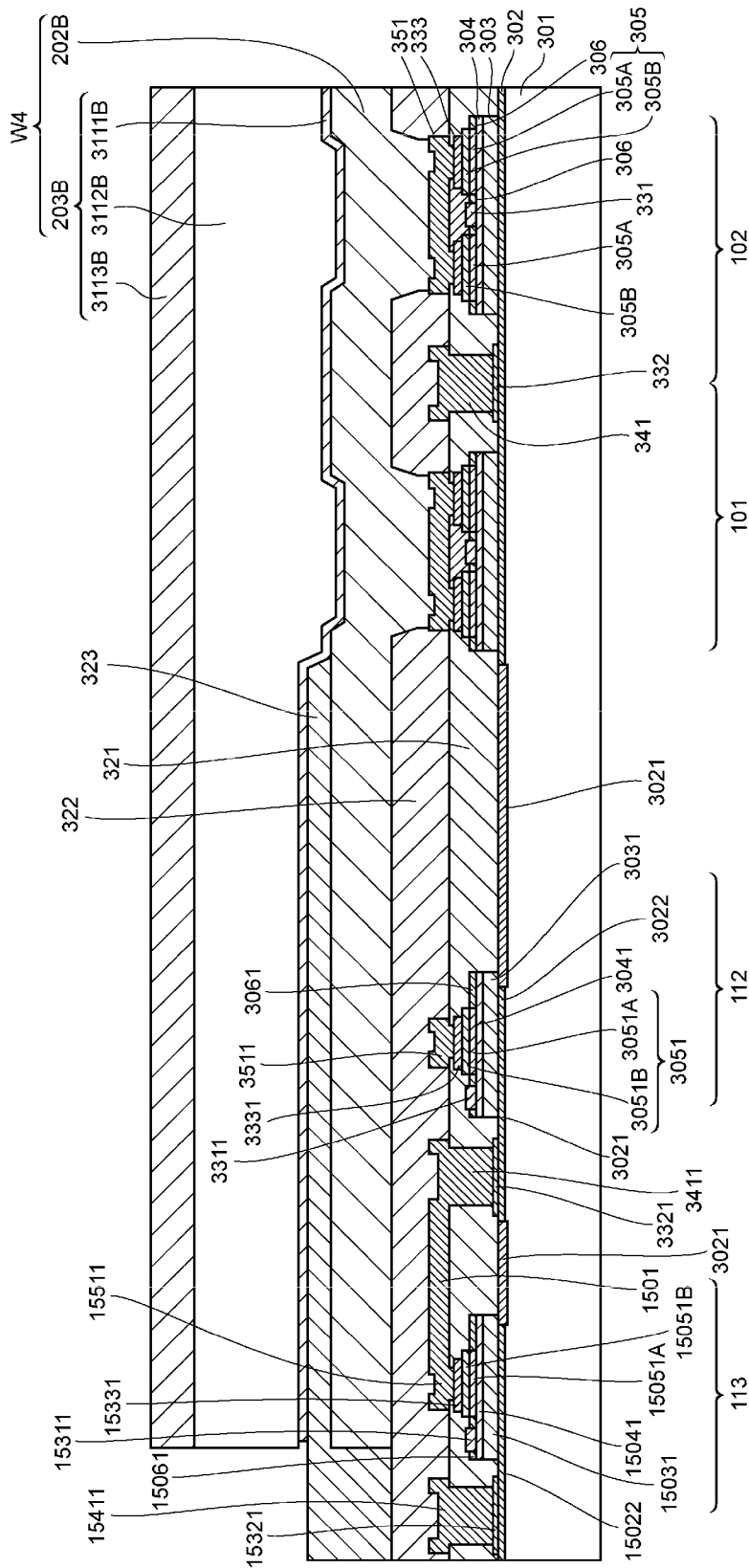
FIG. 15 is a cross-sectional view taken along line XV-XV in FIG. 14.

FIG. 15 illustrates a cross-sectional view taken along line XV-XV in FIG. 14. In the transistor 112, the positions of the electrodes are inverted with respect to FIG. 3.

The transistor 113 will be described. The transistor 113 includes, like the transistor 112, a collector layer 15031, a base layer 15041, an emitter layer 15051, and a ledge layer 15061 that are disposed on a sub-collector layer 15022. The emitter layer 15051 includes an intrinsic emitter layer 15051A and an emitter mesa layer 15051B. The collector layer 15031, the base layer 15041, and the emitter layer 15051 constitute the transistor 113. In the transistor 113, as in the transistor 112, a base electrode 15311, a collector electrode 15321, and an emitter electrode 15331 are disposed.

The transistor 113 is formed by the same process as the process of forming the transistors 101 and 102. Thus, the transistor 113 has temperature characteristics similar to those of the transistors 101 and 102.

A first-layer collector wiring line 15411 is disposed on the first insulating layer 321, similarly to the first-layer collector wiring line 3411. A first emitter wiring line 15511 is disposed on the first insulating layer 321, similarly to the first emitter wiring line 3511. The first-layer collector wiring line 3411 and the first emitter wiring line 15511 are connected to each other by a wiring line 1501 disposed on the first insulating layer 321.

Above the transistor 113, the second emitter wiring line 202B and the bump 203B extend from the transistor 112 side. In this case, the second emitter wiring line 202B and the bump 203B, which are two metal layers, constitute a wiring portion W4.

With such extension of the bump 203, variations in current based on changes in the temperature characteristics of the transistor 112 and the transistor 113 cancel each other out so as not to affect the bias current Ib. In other words, cancelling out occurs between a tendency in which the current I2 of the transistor 112 increases and a tendency in which the collector current of the transistor 113 decreases as a result of an increase in the base current I1 of the transistor 111. Thus, the strength the thermal coupling between the transistor 112 and the transistors 101 to 10n can be increased as in the power amplifier circuit 10.

The second emitter wiring line 202 and the bump 203 may extend from a position above the transistors 101 and 102 to the vicinity of a position above only the transistor 113. In this case, the transistor 113 functions as a current output element. Heat conduction occurs from the transistors 101 and 102 to the transistor 113 through the second emitter wiring line 202 or the bump 203. Thus, the strength the thermal coupling between the transistor 113 and the transistors 101 to 10n can be increased as in the power amplifier circuit 10. As a result of increasing the temperature of the transistor 113 by thermal coupling, the collector currents of the transistors 101 to 10n can be decreased and variations in gain during operation can be suppressed as in the case of thermal coupling with the transistor 112.

A second embodiment will be described. In the second embodiment and the following embodiments, a description of the same points as those of the first embodiment will be omitted, and only different points will be described. In particular, similar functions and effects obtained by similar configurations will not be described in each embodiment.

Figure 16:
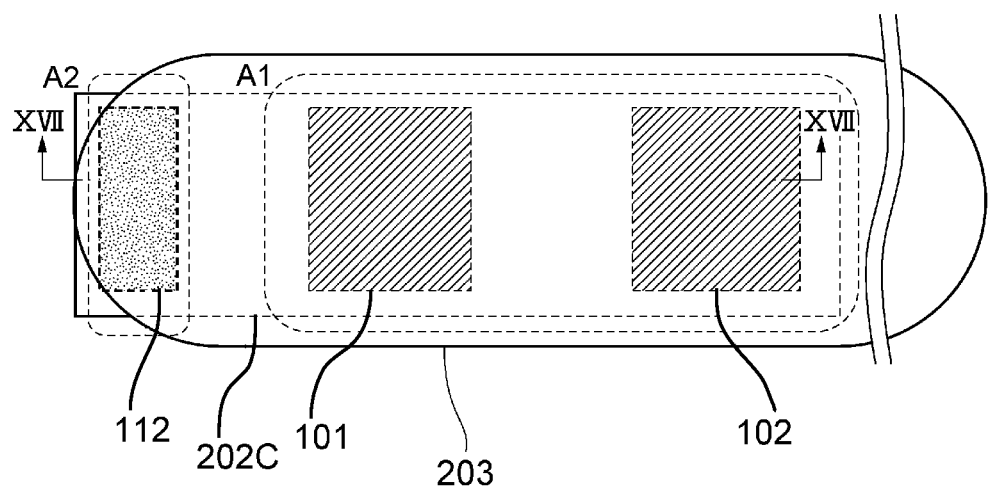
FIG. 16 is a layout diagram of a power amplifier circuit according to a second embodiment.
Figure 16:
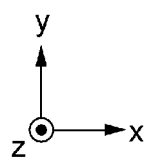
Figure 17:
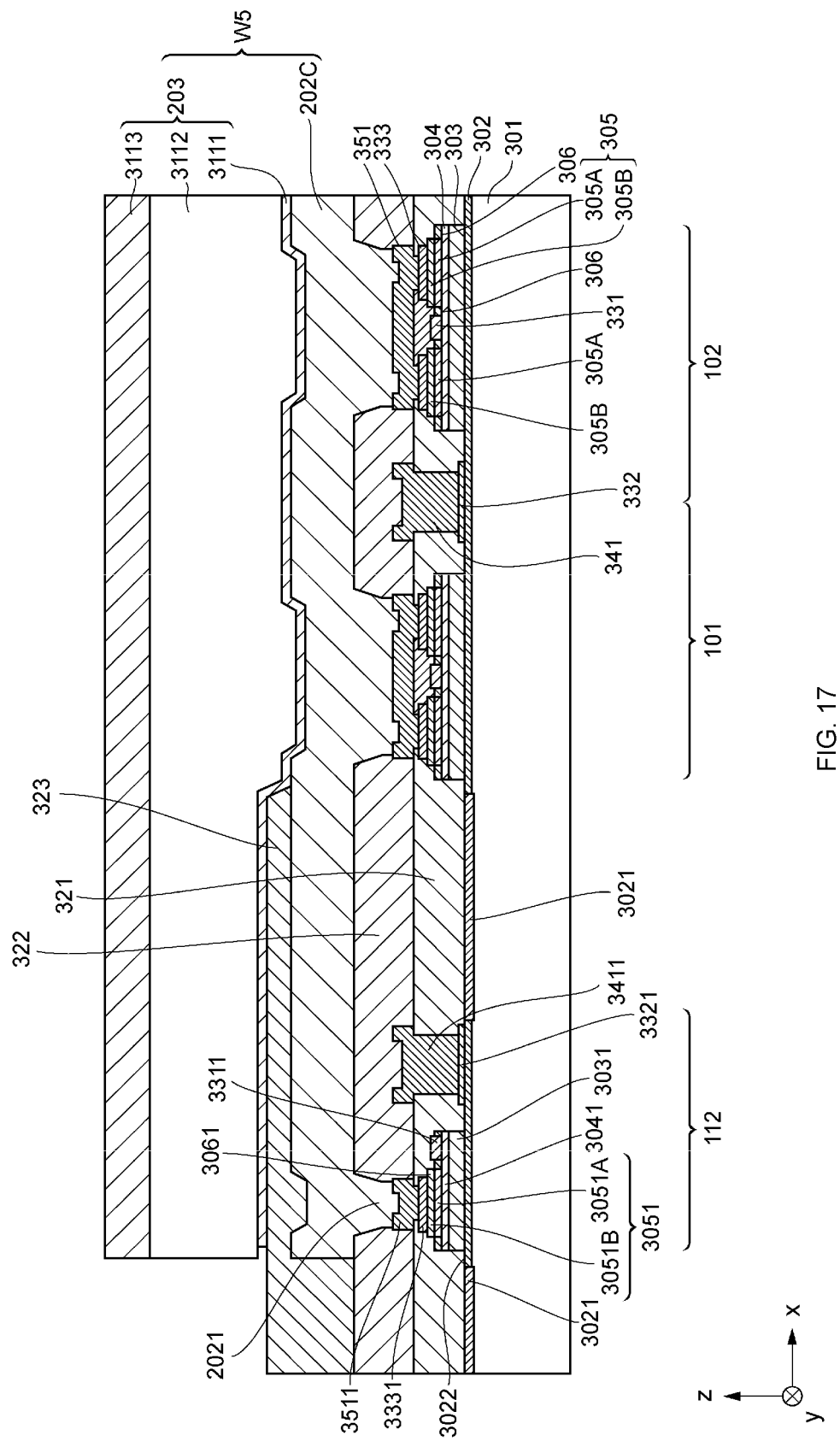
FIG. 17 is a cross-sectional view taken along line XVII-XVII in FIG. 16.

In a power amplifier circuit according to the second embodiment, the individual transistors are disposed similarly to the first embodiment as illustrated in FIG. 16. FIG. 17 illustrates a cross-sectional view taken along line XVII-XVII in FIG. 16.

The power amplifier circuit according to the second embodiment illustrated in FIG. 17 is different from the power amplifier circuit according to the first embodiment in that a second emitter wiring line 202C has a protruding portion 2021.

The protruding portion 2021 extends toward the first emitter wiring line 3511 through a cavity of the second insulating layer 322. The protruding portion 2021 is in ohmic contact with the first emitter wiring line 3511.

In the power amplifier circuit according to the second embodiment, the second emitter wiring line 202C above the transistor 112 is at a position closer to the transistor 112 as illustrated in FIG. 17. Accordingly, more heat is transmitted from the second emitter wiring line 202C to the transistor 112. Thus, the temperature of the transistor 112 increases more and becomes closer to the temperatures of the transistors 101 and 102. In other words, the strength of thermal coupling is higher than in the power amplifier circuit according to the first embodiment. The higher strength of thermal coupling makes it possible to more appropriately achieve the balance in characteristic change between the transistors caused by variations in temperature, and an increase in gain can be further suppressed. In this case, the second emitter wiring line 202C and the bump 203, which are two metal layers, constitute a wiring portion W5.

Figure 18:
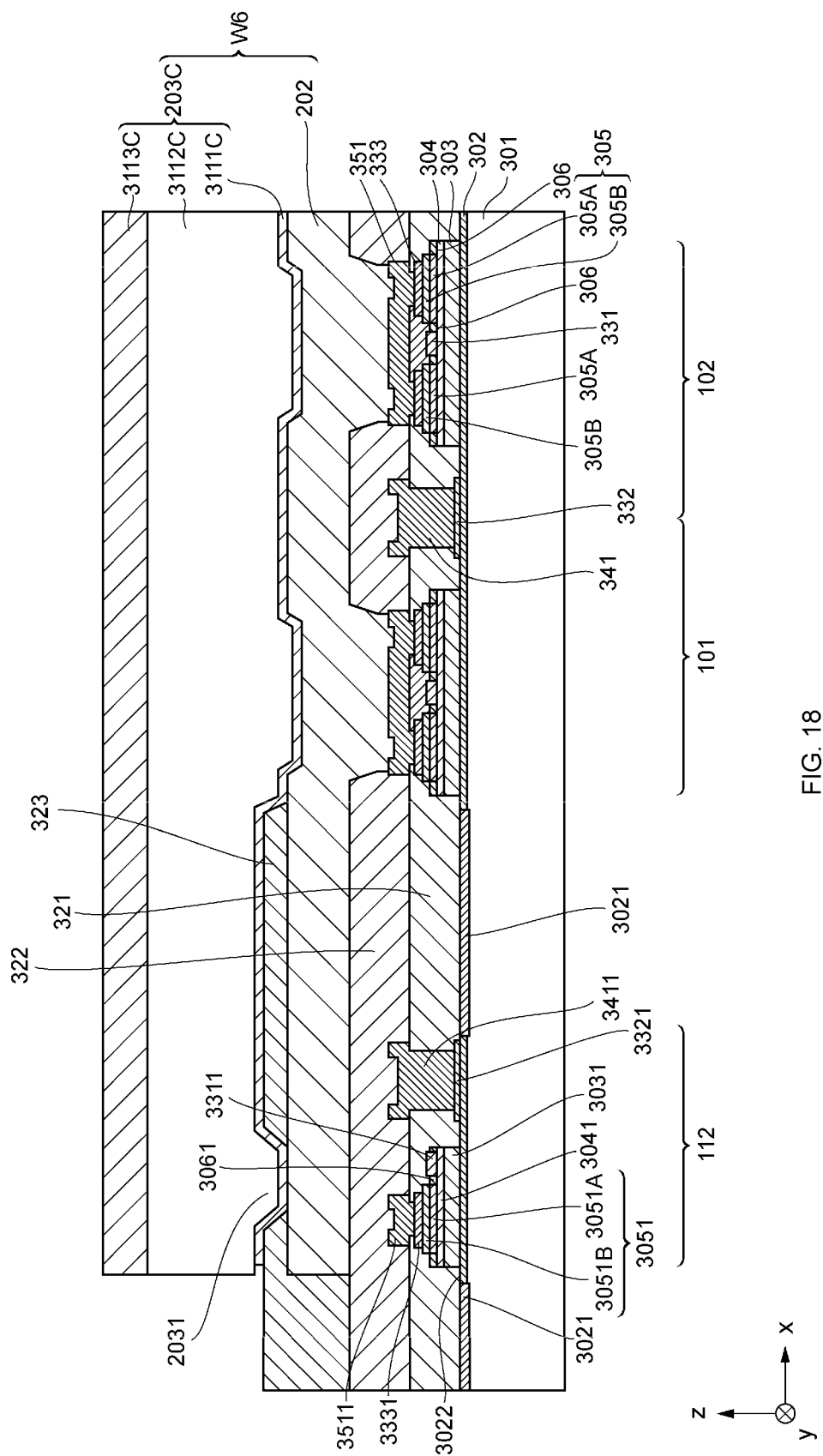
FIG. 18 is a cross-sectional view of another power amplifier circuit according to the second embodiment.

Alternatively, the bump 203 may have a protruding portion. In the cross-sectional view of another power amplifier circuit according to the second embodiment illustrated in FIG. 18, a bump 203C has a protruding portion 2031 which is a part of an under bump metal layer 3111C and a metal post 3112C. The protruding portion 2031 extends toward the second emitter wiring line 202 through a cavity of the third insulating layer 323. The protruding portion 2031 is in ohmic contact with the second emitter wiring line 202. Also, with this configuration, the strength of thermal coupling is higher than in the power amplifier circuit according to the first embodiment. Thus, an increase in gain can be further suppressed. In this case, the bump 203C further includes a solder layer 3113C, and the second emitter wiring line 202 and the bump 203C, which are two metal layers, constitute a wiring portion W6.

Figure 19:
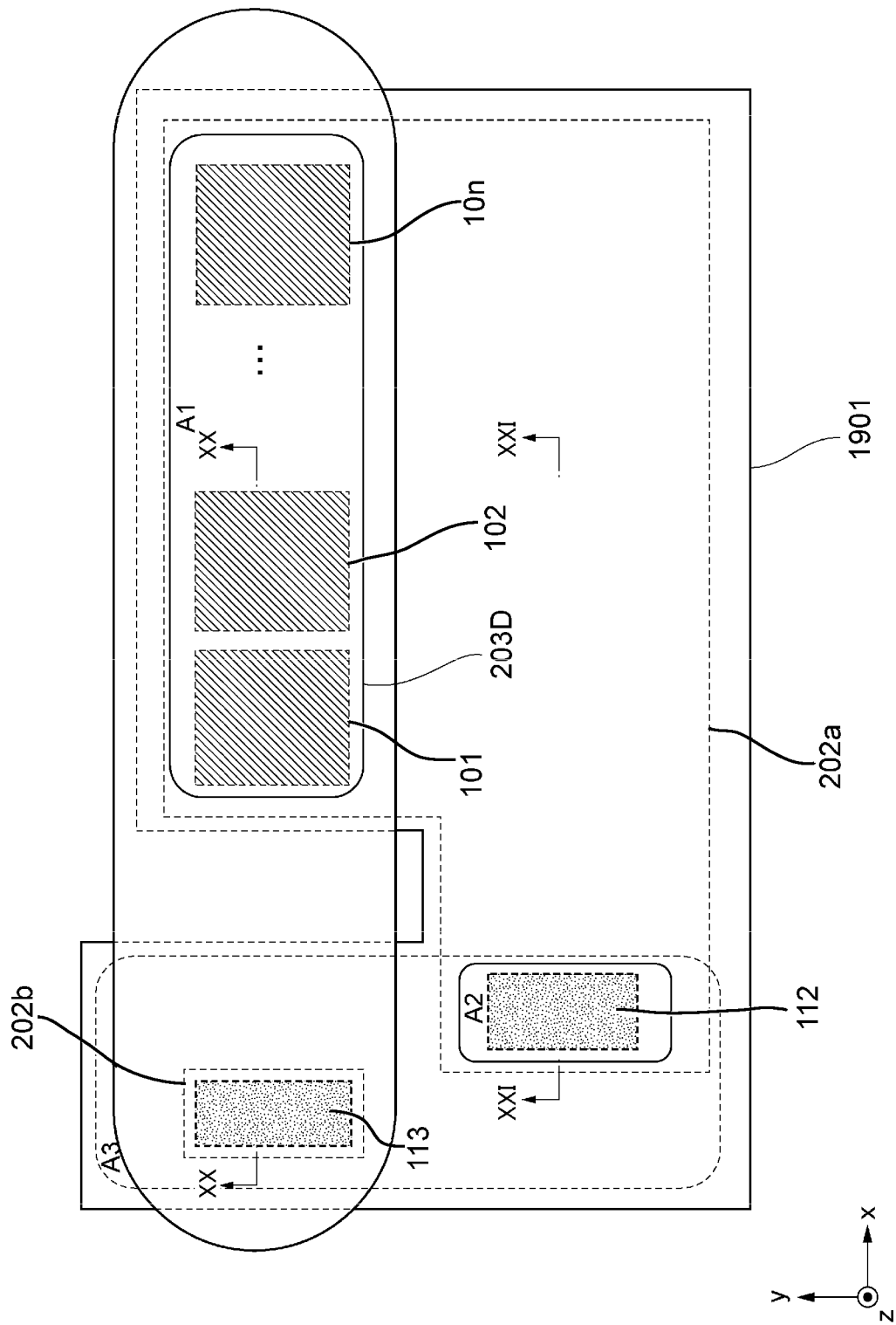
FIG. 19 is a layout diagram of a power amplifier circuit according to a third embodiment.

A third embodiment will be described. FIG. 19 is a layout diagram of a power amplifier circuit according to the third embodiment. In the power amplifier circuit according to the third embodiment, the second emitter wiring line 202 described in the foregoing embodiments includes second emitter wiring lines 202a and 202b isolated from each other. The second emitter wiring line 202a is disposed above the transistors 101 to 10n and the transistor 112. The second emitter wiring line 202b is disposed above the transistor 113.

In the power amplifier circuit according to the third embodiment, a wiring line 1901 is disposed between a bump 203D and the second emitter wiring lines 202a and 202b in the z-axis direction. The wiring line 1901 is made of a metallic material. The wiring line 1901 is disposed along the second emitter wiring line 202 for the transistors 101 to 10n in the disposition area A1 so as to overlap the transistor 113 in the disposition area A3. In the layer in which the wiring line 1901 is disposed, the wiring line 1901 is isolated from the remaining portion for the purpose of insulation. The wiring line 1901 may be regarded as a rewiring line.

Figure 20:
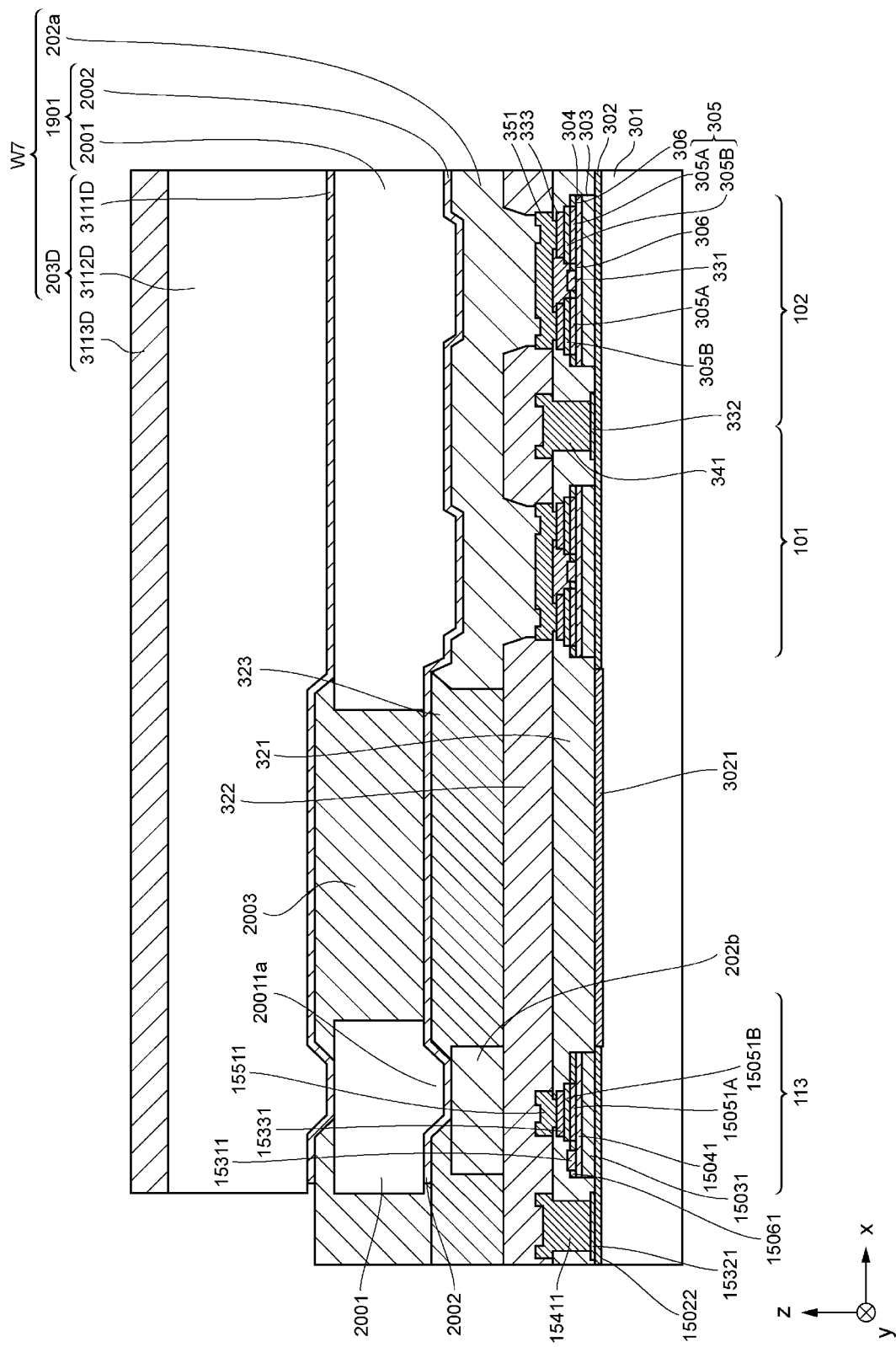
FIG. 20 is a cross-sectional view taken along line XX-XX in FIG. 19.

FIG. 20 illustrates a cross-sectional view taken along line XX-XX in FIG. 19. The wiring line 1901 includes a first metal portion 2001 and a second metal portion 2002. The wiring line 1901 is isolated by an insulating layer 2003 as necessary. The second emitter wiring line 202b, the wiring line 1901, and the bump 203D are located above the transistor 113. The wiring line 1901 and the bump 203D above the transistor 113 have a protruding portion 20011a and the protruding portion 2031, respectively. The second emitter wiring line 202, the wiring line 1901, and the bump 203D, which are three metal layers, constitute a wiring portion W7. The bump 203D includes an under bump metal layer 3111D, a metal post 3112D, and a solder layer 3113D.

Figure 21:
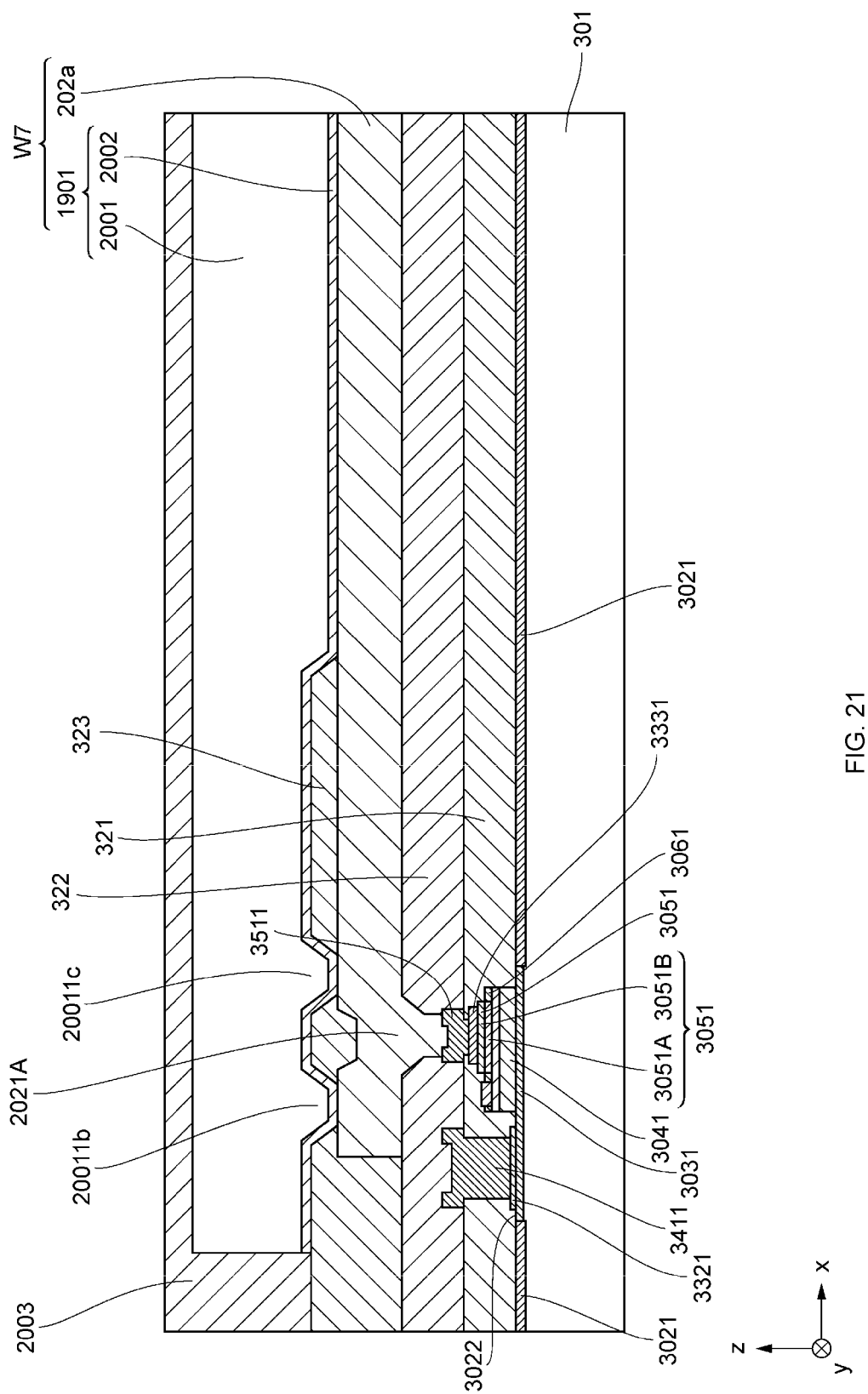
FIG. 21 is a cross-sectional view taken along line XXI-XXI in FIG. 19.

FIG. 21 illustrates a cross-sectional view taken along line XXI-XXI in FIG. 19. In FIG. 21, the second emitter wiring line 202a and the wiring line 1901 are located above the transistor 112. The second emitter wiring line 202a and the wiring line 1901 above the transistor 112 have a protruding portion 2021A and protruding portions 20011b and 20011c, respectively. In this case, the wiring portion W7 is partially constituted by the second emitter wiring line 202a and the wiring line 1901, which are two metal layers.

In such a case where the second emitter wiring line 202 includes the second emitter wiring lines 202a and 202b isolated from each other, heat can be transferred from the disposition area A1 to the disposition areas A2 and A3 through the wiring line 1901. Thus, variations in gain during operation can be suppressed more effectively.

Figure 22:
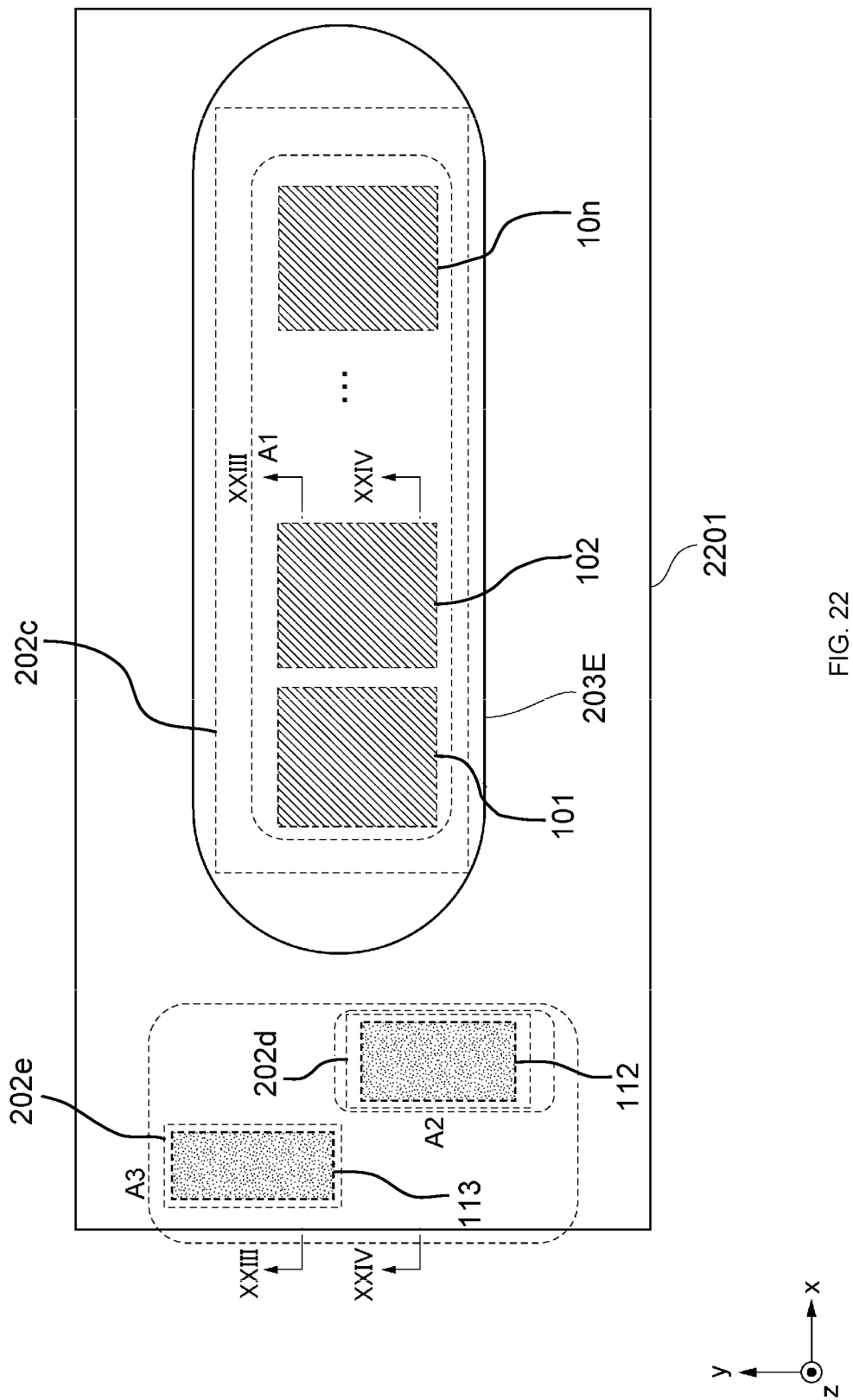
FIG. 22 is a layout diagram of a power amplifier circuit according to a modification example of the third embodiment.

As a modification example of the third embodiment, the layout illustrated in FIG. 22 may be employed, in which heat transfer can be performed by providing a wiring line in a similar manner. In the layout illustrated in FIG. 22, the second emitter wiring line 202 includes second emitter wiring lines 202c, 202d, and 202e isolated from each other. The second emitter wiring line 202c is disposed above the transistors 101 to 10n. The second emitter wiring line 202d is disposed above the transistor 112. The second emitter wiring line 202e is disposed above the transistor 113.

In the layout illustrated in FIG. 22, a wiring line 2201 is disposed between a bump 203E and the second emitter wiring lines 202c, 202d, and 202e in the z-axis direction. The wiring line 2201 is made of a metallic material. The wiring line 2201 is disposed so as to overlap the individual transistors 101 to 10n, 112, and 113 in the disposition areas A1, A2, and A3. In the layer in which the wiring line 2201 is disposed, the wiring line 2201 is isolated from the remaining portion for the purpose of insulation. The wiring line 2201 may be regarded as a rewiring line.

Figure 23:
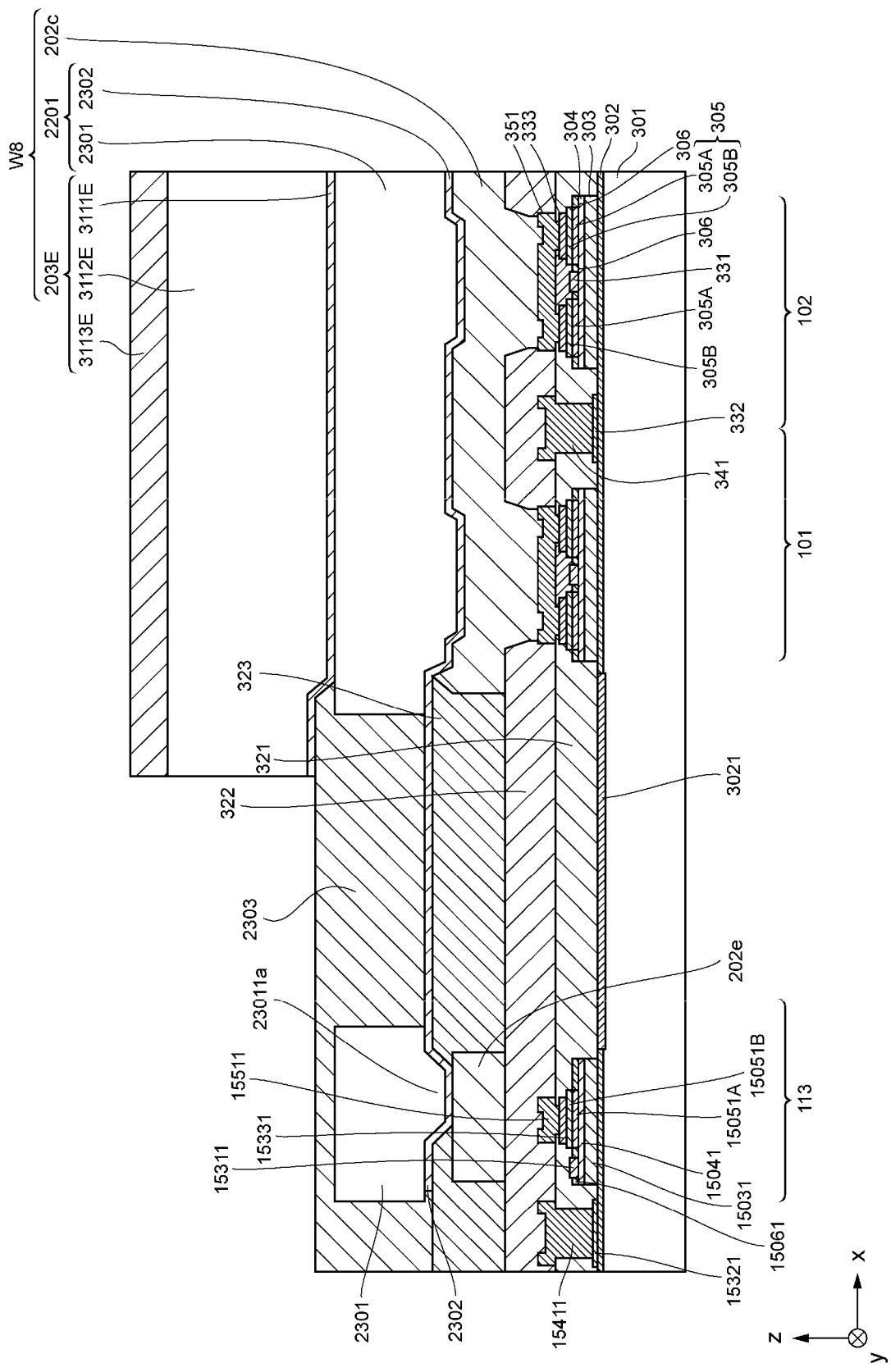
FIG. 23 is a cross-sectional view taken along line XXIII-XXIII in FIG. 22.

FIG. 23 illustrates a cross-sectional view taken along line XXIII-XXIII in FIG. 22. The wiring line 2201 includes a first metal portion 2301 and a second metal portion 2302. The wiring line 2201 is isolated by an insulating layer 2303 as necessary. The second emitter wiring line 202e and the wiring line 2201 are located above the transistor 113. The wiring line 2201 above the transistor 113 has a protruding portion 23011a. The second emitter wiring line 202, the wiring line 2201, and the bump 203E, which are three metal layers, constitute a wiring portion W8. The bump 203E includes an under bump metal layer 3111E, a metal post 3112E, and a solder layer 3113E.

Figure 24:
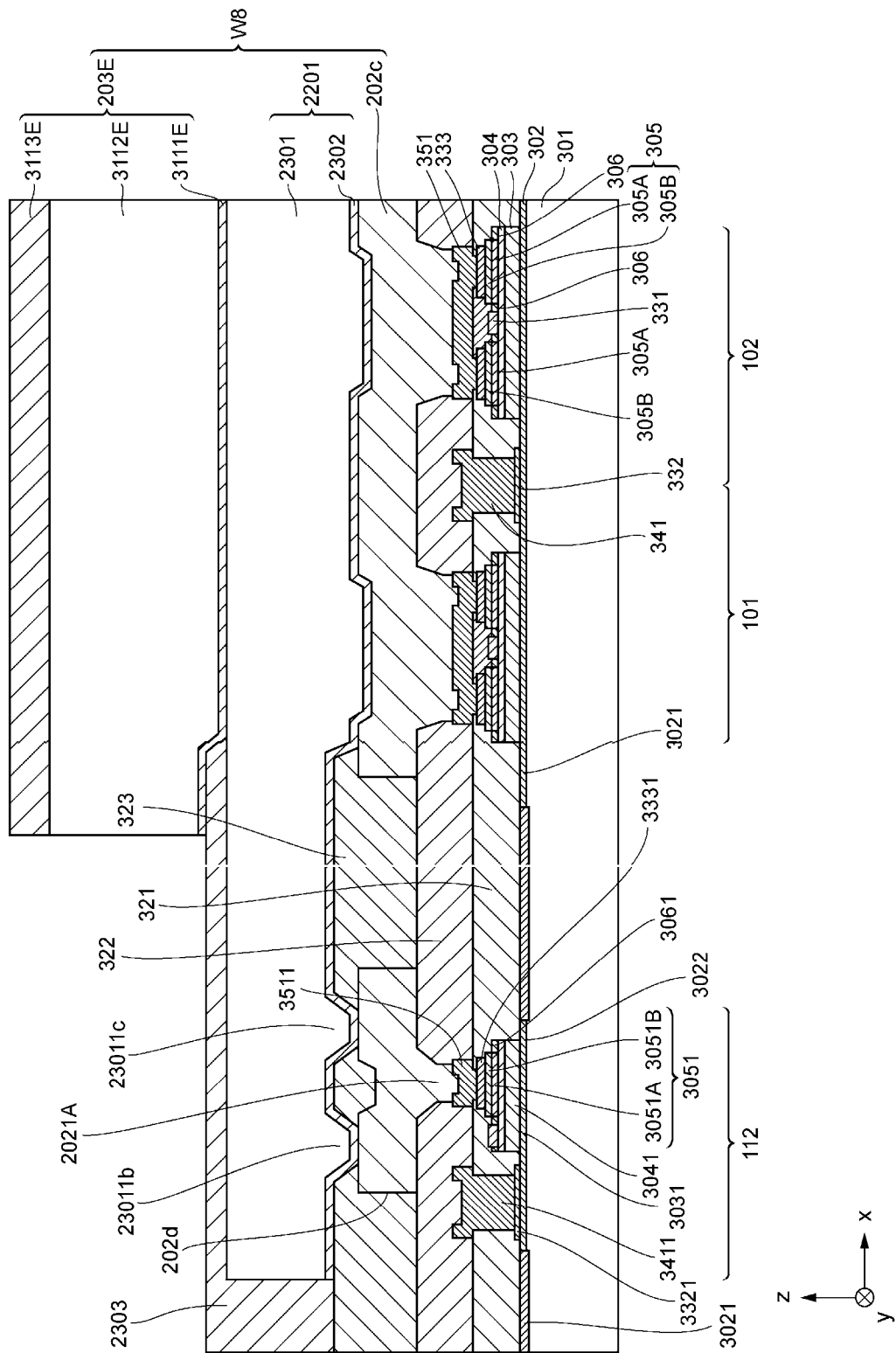
FIG. 24 is a cross-sectional view taken along line XXIV-XXIV in FIG. 22.

FIG. 24 illustrates a cross-sectional view taken along line XXIV-XXIV in FIG. 22. In FIG. 24, the second emitter wiring line 202d and the wiring line 2201 are located above the transistor 112. The second emitter wiring line 202d above the transistor 112 has the protruding portion 2021A. The wiring line 2201 has protruding portions 23011b and 23011c.

As is clear from the modification example illustrated in FIG. 22 to FIG. 24, the wiring line 2201 significantly increases the degree of freedom in designing thermal coupling in the disposition areas A1, A2, and A3.

Figure 25:
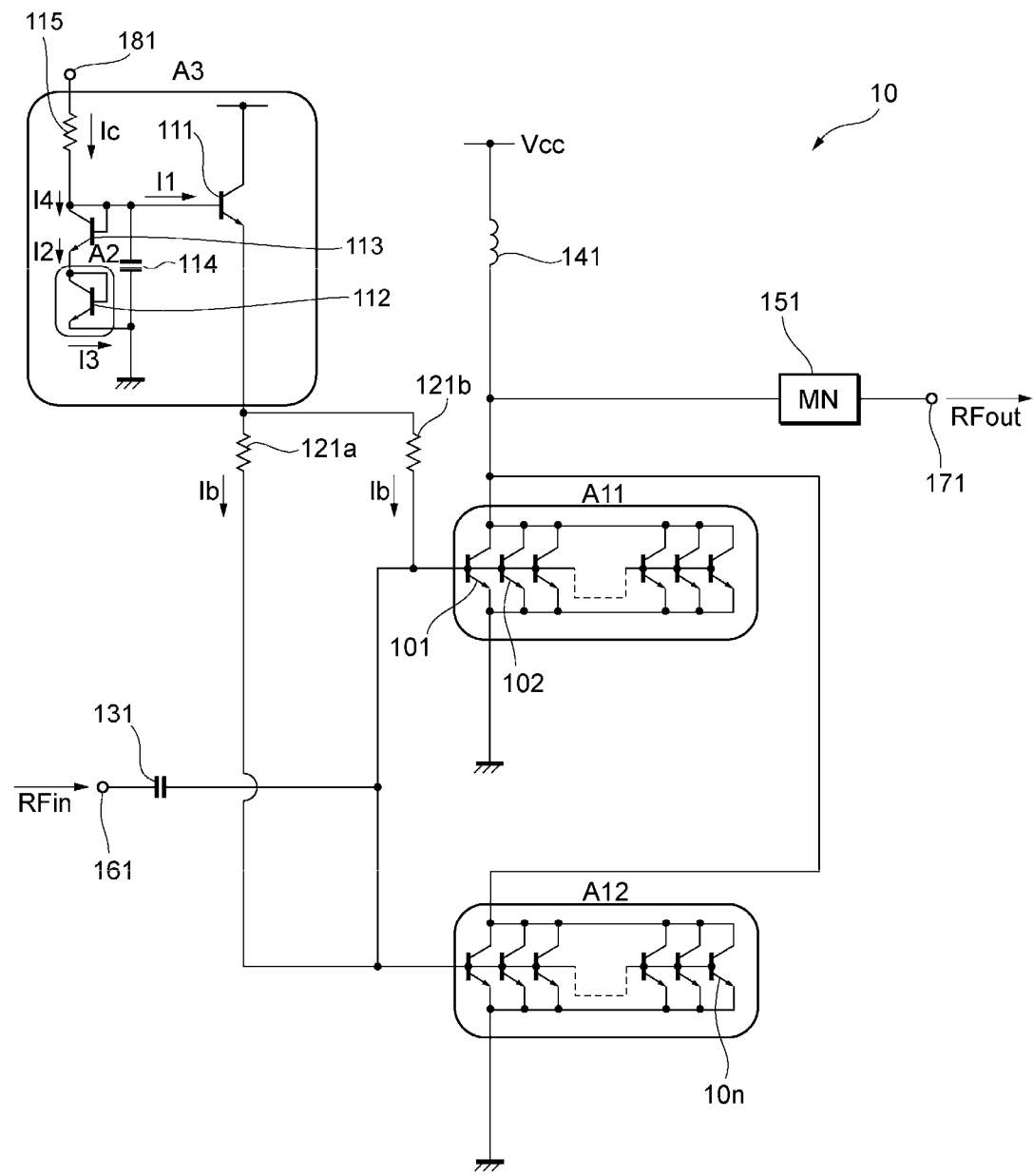
FIG. 25 is a circuit diagram of a power amplifier circuit according to a fourth embodiment.

A fourth embodiment will be described. FIG. 25 illustrates a circuit diagram of a power amplifier circuit 10A according to the fourth embodiment. The power amplifier circuit 10A is different from the power amplifier circuits according to the foregoing embodiments in that the transistors 101 to 10n are disposed both in two disposition areas A11 and A12. The transistor 111 supplies the bias current Ib to the transistors 101 to 10n through resistance elements 121a and 121b.

Figure 26:
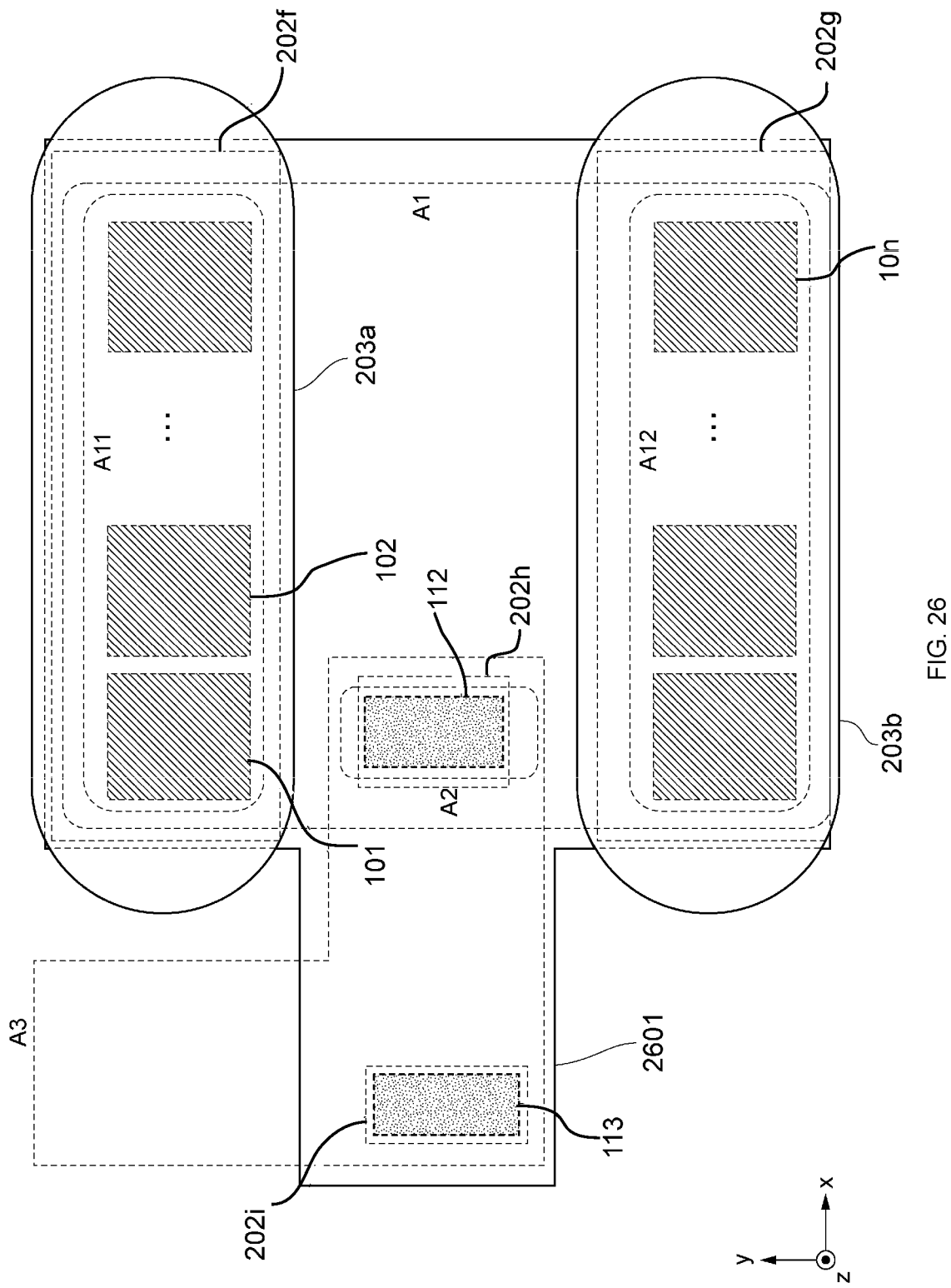
FIG. 26 is a layout diagram of the power amplifier circuit according to the fourth embodiment.

FIG. 26 illustrates a layout diagram of the power amplifier circuit 10A. In the power amplifier circuit 10A, the second emitter wiring line 202 includes second emitter wiring lines 202f, 202g, 202h, and 202i isolated from each other. The second emitter wiring line 202f is disposed above a subset of the transistors 101 to 10n, that is, above the disposition area A11. The second emitter wiring line 202g is disposed above the other subset of the transistors 101 to 10n, that is, above the disposition area A12. The second emitter wiring line 202h is disposed above the transistor 112. The second emitter wiring line 202i is disposed above the transistor 113.

In the layout illustrated in FIG. 26, a wiring line 2601 is disposed between bumps 203a and 203b and the second emitter wiring lines 202f, 202g, 202h, and 202i in the z-axis direction. The wiring line 2601 is made of a metallic material. The wiring line 2601 is disposed so as to overlap the individual transistors 101 to 10n, 112, and 113 in the disposition areas A11, A12, A2, and A3. In the layer in which the wiring line 2601 is disposed, the wiring line 2601 is isolated from the remaining portion for the purpose of insulation. The wiring line 2601 may be regarded as a rewiring line.

As illustrated in FIG. 26, also in a case where the disposition area A1 includes a plurality of areas, such as the disposition areas A11 and A12 divided from each other, variations in gain during operation can be suppressed by applying one embodiment of the present disclosure. In this case, the disposition area A1 including the disposition areas A11 and A12 is connected to the disposition area A2 via the wiring line 2601.

Figure 27:
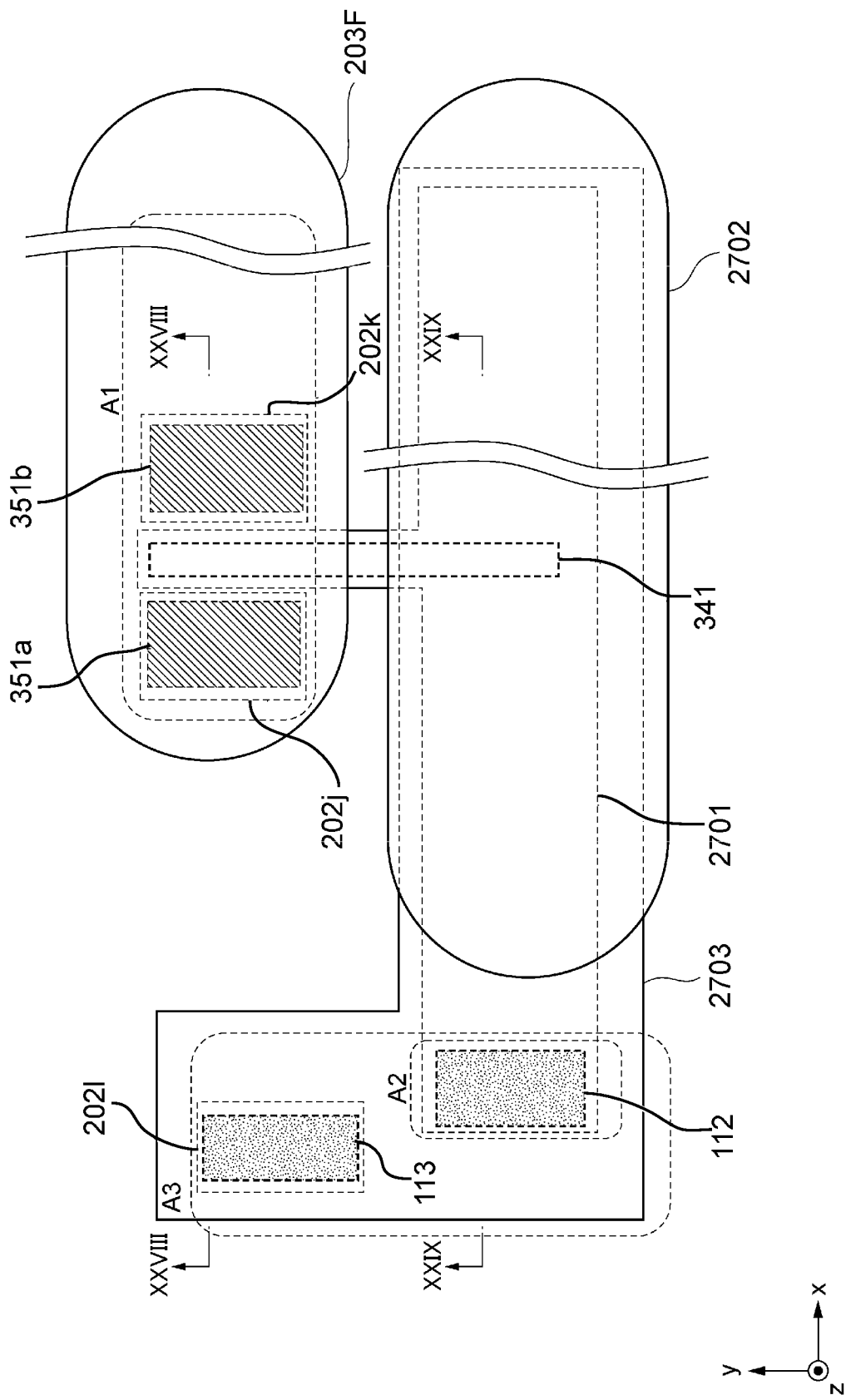
FIG. 27 is a layout diagram of a power amplifier circuit according to a fifth embodiment.

A fifth embodiment will be described. FIG. 27 illustrates a layout diagram of a power amplifier circuit according to the fifth embodiment.

In the layout illustrated in FIG. 27, the second emitter wiring line 202 includes second emitter wiring lines 202j, 202k, and 202l isolated from each other. The second emitter wiring line 202j is disposed on a first emitter wiring line 351a of the transistor 101. The second emitter wiring line 202k is disposed on a first emitter wiring line 351b of the transistor 102. The second emitter wiring line 202l is disposed above the transistor 113. In addition, a wiring line 2701 is disposed along the collector wiring line 341 illustrated in FIG. 27 so as to connect grounds of the transistors 101 to 10n. A bump 2702 is disposed above the wiring line 2701.

In the z-axis direction, a wiring line 2703 is disposed between a set of a bump 203F and the bump 2702, and a set of the second emitter wiring lines 202j, 202k, and 202l and the wiring line 2701. The wiring line 2703 is made of a metallic material. The wiring line 2703 is disposed so as to overlap the individual transistors 101 to 10n, 112, and 113 in the disposition areas A1, A2, and A3. In the layer in which the wiring line 2703 is disposed, the wiring line 2703 is isolated from the remaining portion for the purpose of insulation.

Figure 28:
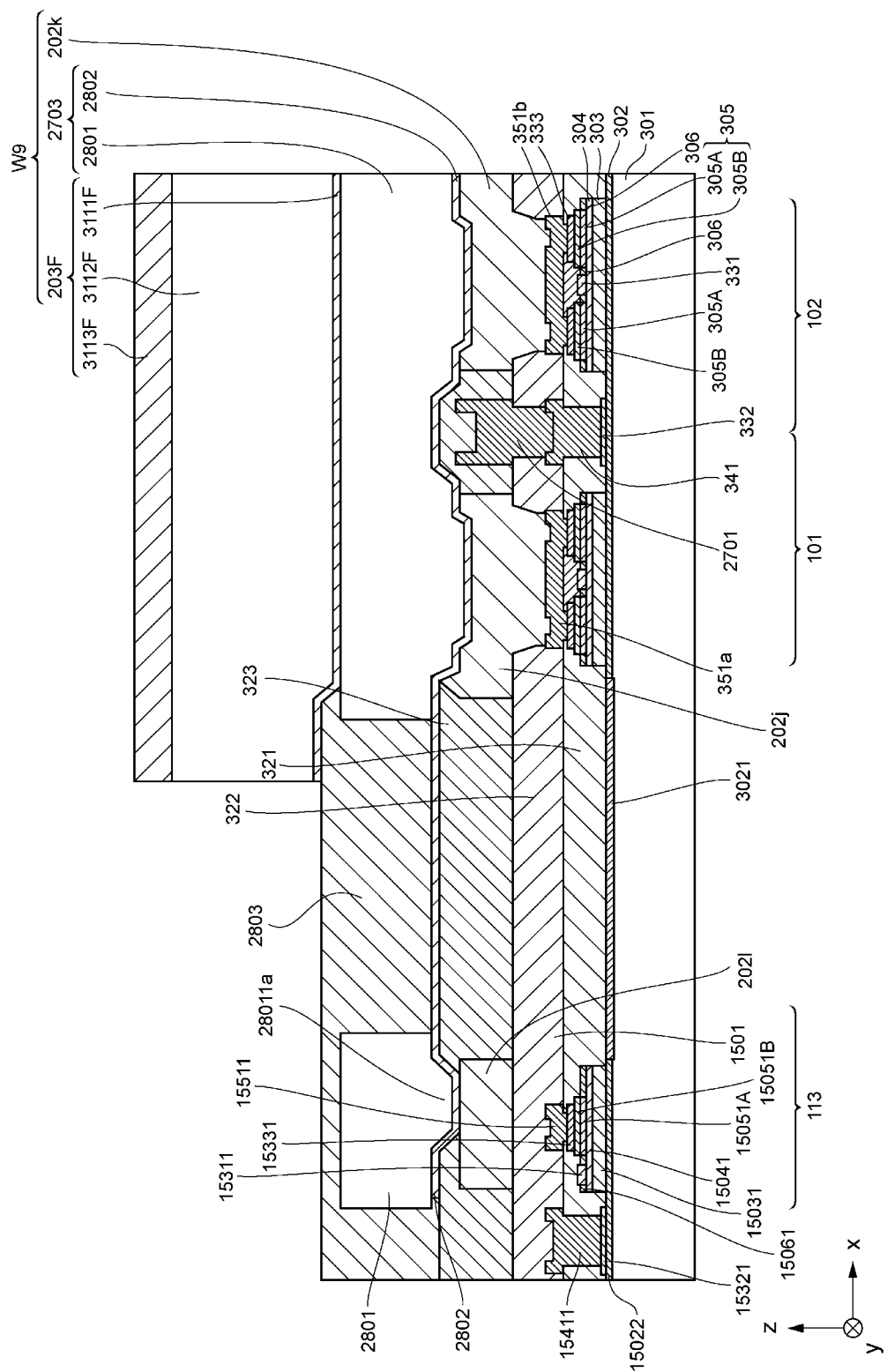
FIG. 28 is a cross-sectional view taken along line XXVIII-XXVIII in FIG. 27.

FIG. 28 illustrates a cross-sectional view taken along line XXVIII-XXVIII in FIG. 27. The wiring line 2703 includes a first metal portion 2801 and a second metal portion 2802. The wiring line 2703 is isolated by an insulating layer 2803 as necessary. The second emitter wiring line 202l and the wiring line 2703 are located above the transistor 113. The wiring line 2703 above the transistor 113 has a protruding portion 28011a. The second emitter wiring line 202, the wiring line 2703, and the bump 203F, which are three metal layers, and a wiring line or the like described below constitute a wiring portion W9. The bump 203F includes an under bump metal layer 3111F, a metal post 3112F, and a solder layer 3113F.

Figure 29:
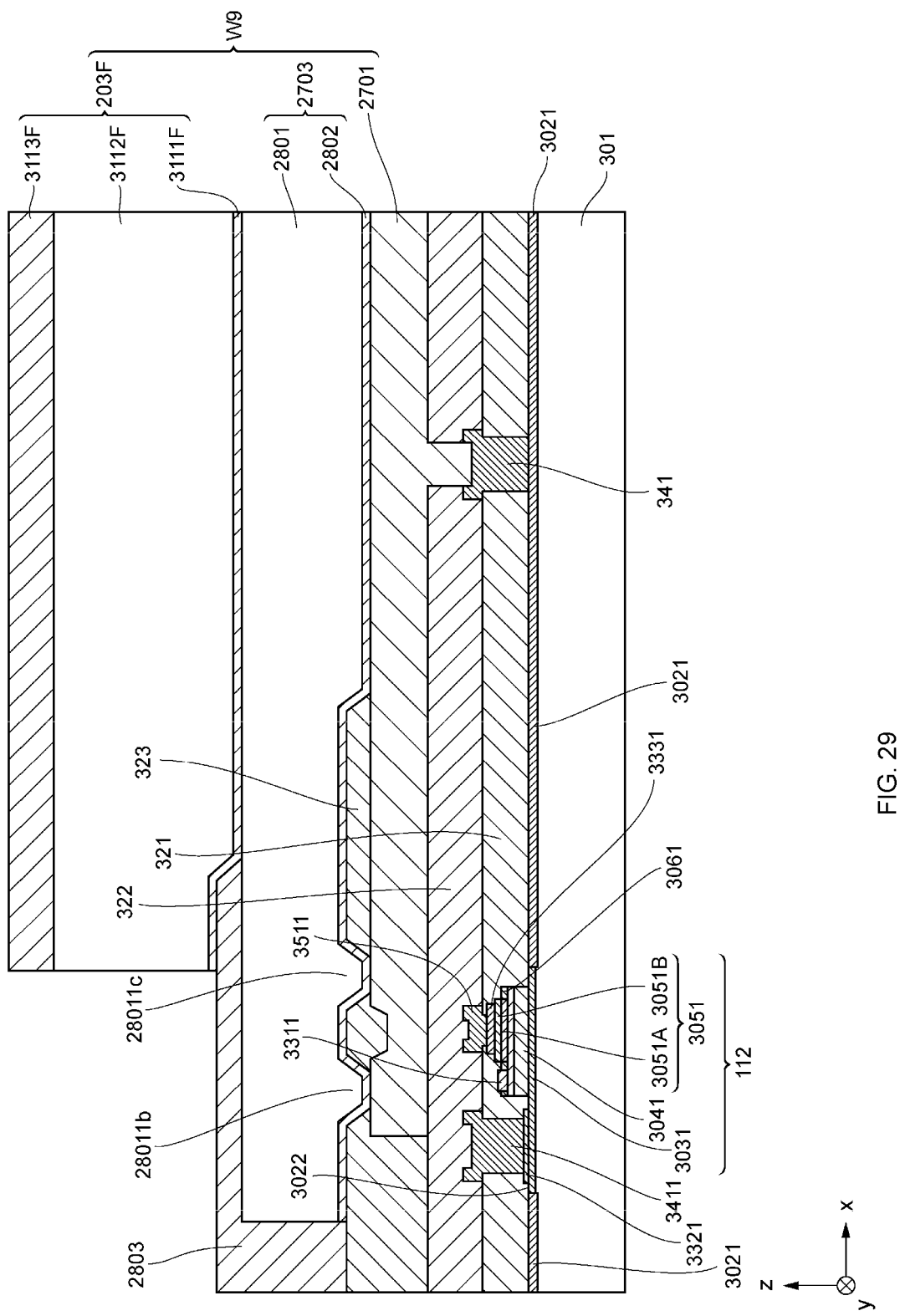
FIG. 29 is a cross-sectional view taken along line XXIX-XXIX in FIG. 27.

FIG. 29 illustrates a cross-sectional view taken along line XXIX-XXIX in FIG. 27. In FIG. 29, the wiring lines 2701 and 2703 are located above the transistor 112. The wiring line 2703 above the transistor 112 has protruding portions 28011b and 28011c. Also, with this configuration, the strength of the thermal coupling between the transistor 112 and the transistors 101 to 10n can be increased and variations in gain during operation can be suppressed. The wiring line 2701, the wiring line 2703, and the bump 2702, which are three metal layers, constitute the wiring portion W9.

Exemplary embodiments of the present disclosure have been described above. The power amplifier circuit 10 according to the first embodiment includes the transistor 101 disposed on the semiconductor substrate 301; the transistor 111 disposed on the semiconductor substrate 301 and having a base configured to be supplied with the current I1 which is a part of the control current Ic, the transistor 111 being configured to supply the bias current Ib based on the current I1 to the transistor 101; the transistor 112 disposed on the semiconductor substrate 301 and configured to be supplied with the current I2 which is a part of the control current Ic and to output the current I3 based on the current I2, the current I2 increasing in accordance with a rise in temperature; and the wiring portion W1 including the second emitter wiring line 202 and the bump 203 that are disposed so as to overlap at least a part of the disposition area A1 in which the transistor 101 is disposed and an area between the disposition area A1 and the disposition area A2 in which the transistor 112 is disposed, that are electrically connected to the emitter of the transistor 101, and that are stacked one on top of another so as to oppose the semiconductor substrate 301. At least one of the second emitter wiring line 202 and the bump 203 extends so as to overlap an area extending from the at least the part of the disposition area A1 to the disposition area A2 in plan view of the semiconductor substrate 301.

This configuration enables heat transfer through the second emitter wiring line 202 and the bump 203, and thus increases the strength of the thermal coupling between the transistor 112 and the transistors 101 and 102 that generate heat during operation. The increased strength of the thermal coupling makes it possible to adjust the bias current Ib in accordance with a change in characteristics resulting from a change in the temperature of the transistor 101, and thus variations in gain during operation can be suppressed.

In the power amplifier circuit 10, both the second emitter wiring line 202 and the bump 203 of the wiring portion W1 may extend so as to overlap the disposition area A1 and the disposition area A2. This configuration makes it possible to transmit heat to a position closer to the transistor 112. Thus, the strength of the thermal coupling between the transistor 101 and the transistor 112 is further increased.

The uppermost metal layer of the wiring portion W1 is the bump 203. Thus, in a case where a semiconductor device including the power amplifier circuit 10 is flip-chip connected, the bump 203 serving as a heat path to the substrate extends to a position close to the transistor 112. Thus, the strength of the thermal coupling between the transistor 112 and the transistors 101 and 102 can be increased.

In the power amplifier circuit according to the second embodiment, the second emitter wiring line 202C has the protruding portion 2021 extending toward the transistor 112. Thus, the strength of the thermal coupling between the transistor 101 and the transistor 112 is further increased.

In a power amplifier circuit according to another embodiment, a wiring portion may extend so as to overlap an area between the disposition area A1 and the disposition area A3. Also, in this embodiment, the strength of the thermal coupling between the transistor 101 and the transistor 112 can be increased.

Alternatively, the wiring portion may extend so as to overlap an area between the disposition area A1 and the disposition area A2 and to overlap an area which is between the disposition area A1 and the disposition area A2 and which is the disposition area A3 except for the area. Also, in this embodiment, the strength of the thermal coupling between the transistor 101 and the transistor 112 can be increased.

The power amplifier circuit according to the fifth embodiment includes the transistor 101 disposed on the semiconductor substrate 301; the transistor 111 disposed on the semiconductor substrate 301 and having a base configured to be supplied with the current I1 which is a part of the control current Ic, the transistor 111 being configured to supply the bias current Ib based on the current I1 to the transistor 101; the transistor 112 disposed on the semiconductor substrate 301 and configured to be supplied with the current I2 which is a part of the control current Ic and to output the current I3 based on the current I2, the current I2 increasing in accordance with a rise in temperature; and the wiring portion W9 including the wiring line 2701, the wiring line 2703, and the bump 2702 that are disposed so as to overlap the disposition area A1 in which the transistor 101 is disposed and an area between the disposition area A1 and the disposition area A2 in which the transistor 112 is disposed, that are electrically connected to the collector of the transistor 101, and that are stacked one on top of another so as to oppose the semiconductor substrate 301. Any one of the wiring line 2701, the wiring line 2703, and the bump 2702 extends so as to overlap an area extending from the disposition area A1 to the disposition area A2 in plan view of the semiconductor substrate 301. Also, in this embodiment, the strength of the thermal coupling between the transistor 101 and the transistor 112 can be increased.

Each of the above-described embodiments can be applied to individual amplification stages of a power amplifier circuit. For example, in a power amplifier circuit having a three-stage configuration, the strength of the thermal coupling between a transistor and a bias circuit can be increased in at least one amplification stage.

As an example, in a power amplifier circuit having a three-stage configuration, an increase in gain can be further suppressed by increasing the strength of the thermal coupling between a transistor and a bias circuit in the second stage and between a transistor and a bias circuit in the final stage.

The individual embodiments described above are given for facilitating the understanding of the present disclosure and are not for interpreting the present disclosure in a limited manner. The present disclosure can be modified or improved without necessarily deviating from the gist thereof, and includes the equivalents thereof. That is, an embodiment obtained by appropriately changing the design of one of the embodiments by a person skilled in the art is included in the scope of the present disclosure as long as the embodiment has a feature of the present disclosure. For example, the individual elements of the individual embodiments, and the dispositions, materials, conditions, shapes, sizes, and so forth thereof are not limited to those described as an example and can be changed as appropriate. Each of the embodiments is merely an example. Obviously, configurations illustrated in different embodiments can be partially replaced or combined, and the replacement or combination is also included in the scope of the present disclosure as long as the replacement or combination has a feature of the present disclosure. The scope of the disclosure is to be determined solely by the following claims.

What is claimed is:

1. A power amplifier circuit comprising:
a first transistor on a semiconductor substrate;
a second transistor on the semiconductor substrate, the second transistor having a base supplied with a first current and being configured to supply a bias current based on the first current to the first transistor;
a current output circuit element on the semiconductor substrate, the current output circuit element being supplied with a second current and being configured to output a third current based on the second current, the second current increasing in accordance with a rise in temperature; and
wiring comprising a plurality of metal layers that are electrically connected to an emitter of the first transistor and that are stacked on top of each other,
wherein the first current and the second current are part of a control current, and
wherein, as seen in a plan view of the semiconductor substrate:
the plurality of metal layers overlap the first transistor and an area between the first transistor and the current output circuit element, and
at least one of the plurality of metal layers further overlaps the current output circuit element.

2. The power amplifier circuit according to claim 1, wherein all of the plurality of metal layers further overlap the current output circuit element.

3. The power amplifier circuit according to claim 1, wherein an uppermost one of the plurality of metal layers is a bump.

4. The power amplifier circuit according to claim 1, wherein at least one of the plurality of metal layers comprises, at a position that overlaps the current output circuit element, a protrusion that extends in a thickness direction of the semiconductor substrate toward the current output circuit element.

5. The power amplifier circuit according to claim 2, wherein at least one of the plurality of metal layers comprises, at a position that overlaps the current output circuit element, a protrusion that extends in a thickness direction of the semiconductor substrate toward the current output circuit element.

6. The power amplifier circuit according to claim 2, wherein at least one of the plurality of metal layers comprises, at a position that overlaps the current output circuit element, a protrusion that extends in a thickness direction of the semiconductor substrate toward the current output circuit element.

7. The power amplifier circuit according to claim 4, wherein the wiring is electrically connected to the current output circuit element.

8. A power amplifier circuit comprising:
a first transistor on a semiconductor substrate;
a second transistor on the semiconductor substrate, the semiconductor substrate having a base supplied with a first current and being configured to supply a bias current based on the first current to the first transistor;
a current output circuit element on the semiconductor substrate, the current output circuit element being supplied with a second current and being configured to output a third current based on the second current, the second current increasing in accordance with a rise in temperature;
a third transistor on the semiconductor substrate, the third transistor having a collector supplied with a fourth current and an emitter configured to output the second current based on the fourth current; and
wiring comprising a plurality of metal layers that are electrically connected to an emitter of the first transistor, and that are stacked on top of each other,
wherein the first current, the second current, and the fourth current are part of a control current, and
wherein as seen in a plan view of the semiconductor substrate:
the plurality of metal layers overlap the first transistor and an area between the first transistor and an area defined by the second transistor, the current output circuit element, and the third transistor,
at least one of the plurality of metal layers further overlaps the area defined by the second transistor, the current output circuit element, and the third transistor.

9. The power amplifier circuit according to claim 8, wherein all of the plurality of metal layers further overlap the area defined by the second transistor, the current output circuit element, and the third transistor.

10. The power amplifier circuit according to claim 8, wherein an uppermost one of the plurality of metal layers is a bump.

11. The power amplifier circuit according to claim 9, wherein an uppermost one of the plurality of metal layers is a bump.

12. The power amplifier circuit according to claim 8, wherein at least one of the plurality of metal layers comprises, at a position that overlaps the current output circuit element, a protrusion that extends in a thickness direction of the semiconductor substrate toward the current output circuit element.

13. The power amplifier circuit according to claim 9, wherein at least one of the plurality of metal layers comprises, at a position that overlaps the current output circuit element, a protrusion that extends in a thickness direction of the semiconductor substrate toward the current output circuit element.

14. The power amplifier circuit according to claim 10, wherein at least one of the plurality of metal layers comprises, at a position that overlaps the current output circuit element, a protrusion that extends in a thickness direction of the semiconductor substrate toward the current output circuit element.

15. The power amplifier circuit according to claim 12, wherein the wiring is electrically connected to the current output circuit element.

16. The power amplifier circuit according to claim 8, wherein the at least one metal layer overlaps an area between the first transistor and the second transistor.

17. The power amplifier circuit according to claim 15, wherein:
a first of the plurality of metal layers overlaps the first transistor and the area between the first transistor and the area defined by the second transistor, the current output circuit element, and the third transistor, and a second of the plurality of metal layers overlaps the first transistor and the area between the first transistor and the second transistor.

18. A power amplifier circuit comprising:

a first transistor on a semiconductor substrate;

a second transistor on the semiconductor substrate, the second transistor having a base supplied with a first current and being configured to supply a bias current based on the first current to the first transistor;

a current output circuit element on the semiconductor substrate, the current output circuit element being supplied with a second current and being configured to output a third current based on the second current, the second current increasing in accordance with a rise in temperature; and wiring comprising a plurality of metal layers that are electrically connected to a collector of the first transistor, and that are stacked one on top of each other, wherein the first current and the second current are part of a control current, and wherein, as seen in a plan view of the semiconductor substrate:

the plurality of metal layers overlap the first transistor and an area between the first transistor and the current output circuit element, and at least one of the plurality of metal layers overlaps the second transistor.

19. The power amplifier circuit according to claim 18, wherein an uppermost one of the metal layers is a bump.

20. The power amplifier circuit according to claim 18, wherein at least one of the plurality of metal layers comprises, at a position that overlaps the current output circuit element, a protrusion that extends in a thickness direction of the semiconductor substrate, toward the current output circuit element.

* * * * *